United States Patent
Choi et al.

(10) Patent No.: US 11,672,143 B2
(45) Date of Patent: Jun. 6, 2023

(54) ORGANIC LIGHT EMITTING DIODE DISPLAY DEVICE

(71) Applicant: Samsung Display Co., Ltd., Yongin-Si (KR)

(72) Inventors: Kyung Hyun Choi, Cheonan-si (KR); Jin Koo Chung, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 60 days.

(21) Appl. No.: 17/091,276

(22) Filed: Nov. 6, 2020

(65) Prior Publication Data
US 2021/0143371 A1    May 13, 2021

(30) Foreign Application Priority Data
Nov. 7, 2019   (KR) .................. 10-2019-0141958

(51) Int. Cl.
*H01L 51/52* (2006.01)
*H01L 27/32* (2006.01)

(52) U.S. Cl.
CPC ...... *H01L 51/5268* (2013.01); *H01L 51/5253* (2013.01); *H01L 27/3244* (2013.01)

(58) Field of Classification Search
CPC ............. H01L 51/5268; H01L 51/5253; H01L 51/5256
See application file for complete search history.

(56) References Cited

U.S. PATENT DOCUMENTS

| | | | |
|---|---|---|---|
| 11,294,422 B1* | 4/2022 | Srikanth | G06F 1/1686 |
| 2012/0256218 A1* | 10/2012 | Kwack | H01L 51/5268 |
| | | | 257/40 |
| 2020/0027932 A1* | 1/2020 | Choi | H01L 27/3213 |
| 2020/0212147 A1* | 7/2020 | Han | H01L 25/18 |

FOREIGN PATENT DOCUMENTS

| | | | |
|---|---|---|---|
| KR | 1020160096783 A | 8/2016 |
| KR | 1020160117801 A | 10/2016 |
| KR | 1020180005772 A | 1/2018 |
| KR | 1020180018969 A | 2/2018 |

* cited by examiner

*Primary Examiner* — Michele Fan
(74) *Attorney, Agent, or Firm* — Cantor Colburn LLP

(57) ABSTRACT

An organic light emitting diode display device includes a substrate, a first pixel structure, a second pixel structure, a thin film encapsulation structure, and a functional module. The substrate includes a display region and a module region. The display region includes a first pixel region, and the module region includes a second pixel region and a transmissive region. The first pixel structure is disposed in the first pixel region on the substrate. The second pixel structure is disposed in the second pixel region on the substrate. The thin film encapsulation structure is disposed on the first and second pixel structures, and includes a plurality of scatterers in the first module region. The functional module is disposed in the module region on a bottom surface of the substrate.

20 Claims, 19 Drawing Sheets

FIG. 6
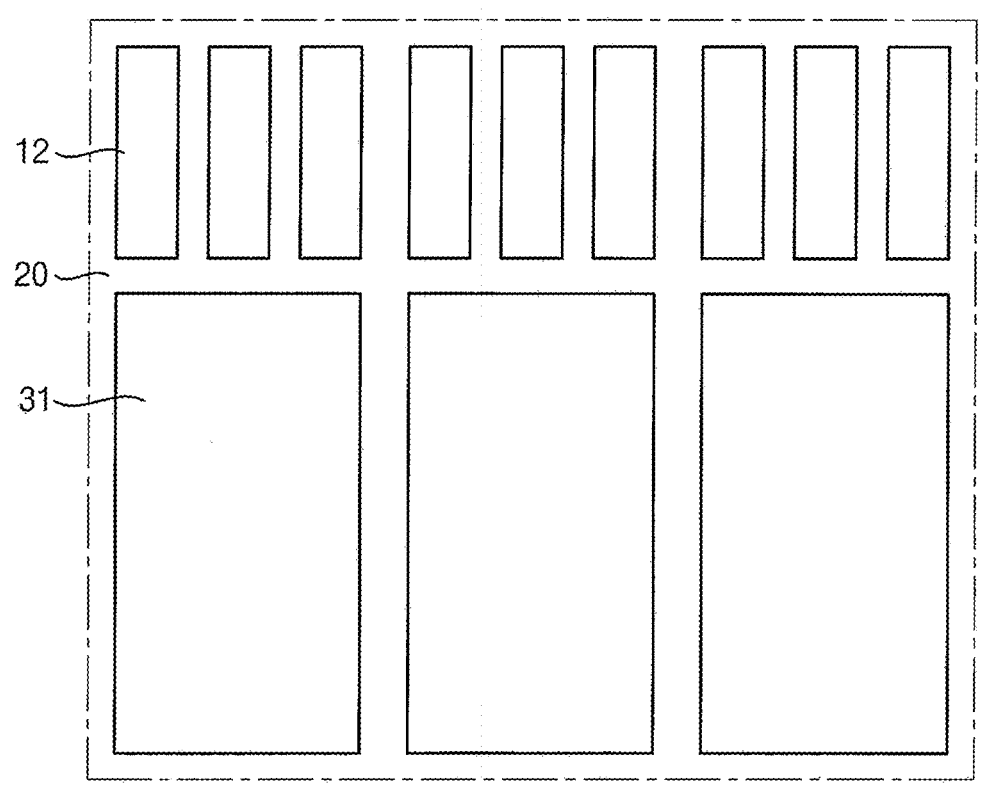
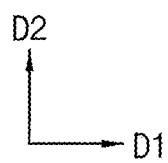

FIG. 11
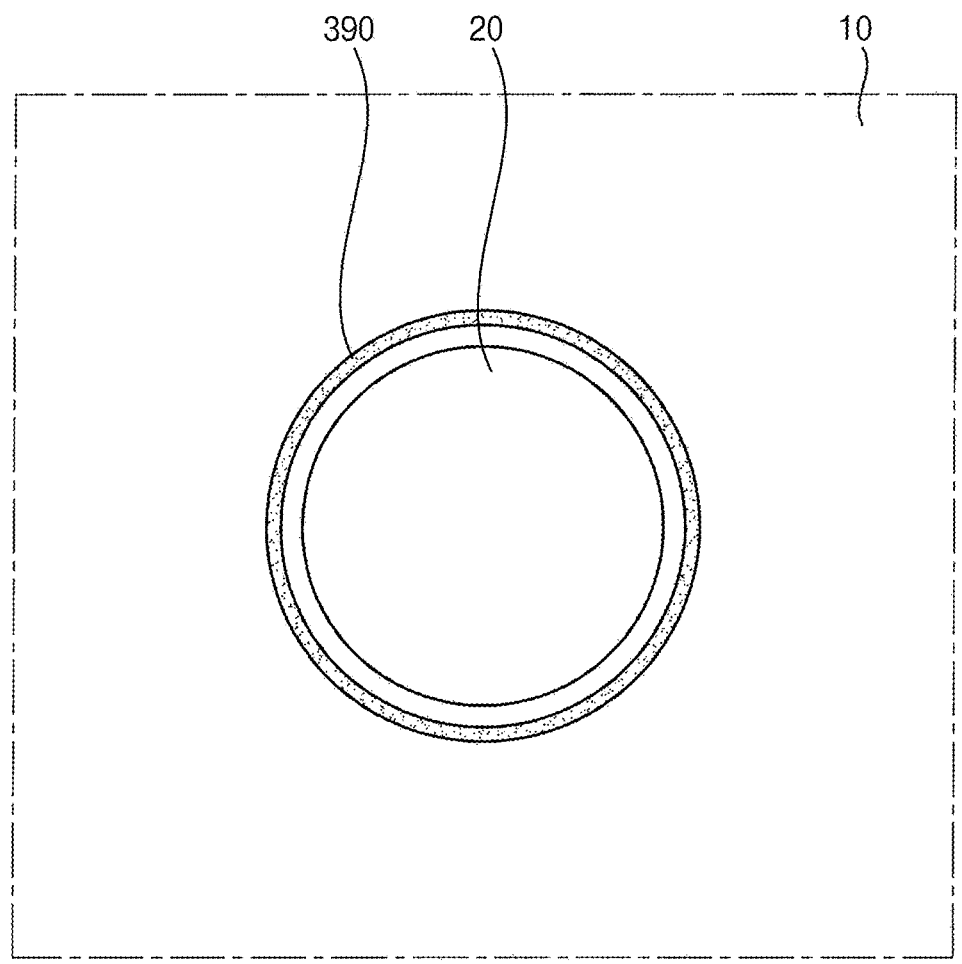
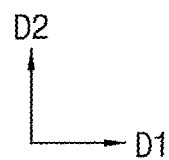

ORGANIC LIGHT EMITTING DIODE DISPLAY DEVICE

This application claims priority to Korean Patent Application No. 10-2019-0141958, filed on Nov. 7, 2019, and all the benefits accruing therefrom under 35 USC § 119, the content of which in its entirety is herein incorporated by reference.

BACKGROUND

1. Field

Exemplary embodiments relate generally to an organic light emitting diode display device. More particularly, embodiments of the invention relate to an organic light emitting diode display device including a functional module.

2. Description of the Related Art

Flat panel display devices are widely used as display devices due to lightweight and thin characteristics thereof. Such flat panel display devices include a liquid crystal display device and an organic light emitting diode display device.

The organic light emitting diode display device may include a display region configured to display an image and a non-display region, and a functional module may be disposed in the non-display region. The functional module may include: a camera module for capturing an image of an object which is located over a front surface of the organic light emitting diode display device; a face recognition sensor module for detecting a face of a user; a pupil recognition sensor module for detecting a pupil of the user; an acceleration sensor module and a geomagnetic sensor module for determining a movement of the organic light emitting diode display device; a proximity sensor module and an infrared sensor module for detecting proximity with respect to a front side of the organic light emitting diode display device; or an illuminance sensor module for measuring a degree of brightness when left in a pocket or a bag, for example. Since the functional modules are typically disposed in the non-display region of the organic light emitting diode display device, an image may not be displayed at a portion where the functional modules are disposed.

SUMMARY

Exemplary embodiments provide an organic light emitting diode display device including a functional module.

According to an exemplary embodiment, an organic light emitting diode display device includes a substrate, a first pixel structure, a second pixel structure, a thin film encapsulation structure, and a functional module. In such an embodiment, the substrate includes a display region and a module region. In such an embodiment, the display region includes a first pixel region, and the module region includes a second pixel region and a transmissive region. In such an embodiment, the first pixel structure is disposed in the first pixel region on the substrate. In such an embodiment, the second pixel structure is disposed in the second pixel region on the substrate. In such an embodiment, the thin film encapsulation structure is disposed on the first and second pixel structures, and includes a plurality of scatterers in the module region. In such an embodiment, the functional module is disposed in the module region on a bottom surface of the substrate.

In an exemplary embodiment, the thin film encapsulation structure may include a first inorganic thin film encapsulation layer disposed on the first and second pixel structures, a first organic thin film encapsulation layer disposed on the first inorganic thin film encapsulation layer, and a second inorganic thin film encapsulation layer disposed on the first organic thin film encapsulation layer.

In an exemplary embodiment, the scatterers may be disposed inside a portion of the first organic thin film encapsulation layer located in the module region.

In an exemplary embodiment, a refractive index of the first organic thin film encapsulation layer located in the display region may be different from a refractive index of the first organic thin film encapsulation layer located in the first module region.

In an exemplary embodiment, the scatterers may include low refractive scatterers and high refractive scatterers.

In an exemplary embodiment, the display region may surround at least a portion of the module region.

In an exemplary embodiment, the organic light emitting diode display device may further include a partition structure disposed at an outer periphery of the module region on the substrate to surround the second pixel structure.

In an exemplary embodiment, the thin film encapsulation structure may include a first inorganic thin film encapsulation layer disposed on the first and second pixel structures and the partition structure, a first organic thin film encapsulation layer disposed in the display region on the first inorganic thin film encapsulation layer, a second organic thin film encapsulation layer disposed in the first module region on the first inorganic thin film encapsulation layer, and a second inorganic thin film encapsulation layer disposed on the first and second organic thin film encapsulation layers.

In an exemplary embodiment, the scatterers may be disposed inside the second organic thin film encapsulation layer.

In an exemplary embodiment, the first organic thin film encapsulation layer may be disposed on an outer side of the partition structure, and the second organic thin film encapsulation layer may be disposed on an inner side of the partition structure. In such an embodiment, a refractive index of the first organic thin film encapsulation layer may be different from a refractive index of the second organic thin film encapsulation layer.

According to an exemplary embodiment, an organic light emitting diode display device includes a substrate, a first pixel structure, a second pixel structure, a third pixel structure, a first partition structure, a thin film encapsulation structure, a first functional module, and a second functional module. In such an embodiment, the substrate includes a display region, a first module region, and a second module region. In such an embodiment, the display region includes a first pixel region, and the first module region includes a second pixel region and a first transmissive region. In such an embodiment, the second module region is spaced apart from the first module region, and includes a third pixel region and a second transmissive region. In such an embodiment, the first pixel structure is disposed in the first pixel region on the substrate. In such an embodiment, the second pixel structure is disposed in the second pixel region on the substrate. In such an embodiment, the third pixel structure is disposed in the third pixel region on the substrate. In such an embodiment, the first partition structure surrounds the second pixel structure. In such an embodiment, the thin film encapsulation structure is disposed on the first, second, and third pixel structures and the first partition structure, and includes a plurality of scatterers in the first and second module regions. In such an embodiment, the first functional module is disposed in the first module region on a bottom surface of the substrate. In such an embodiment, the second functional module is disposed in the second module region on the bottom surface of the substrate.

In an exemplary embodiment, the thin film encapsulation structure may include a first inorganic thin film encapsulation layer disposed on the first, second, and third pixel structures and the first partition structure, a first organic thin film encapsulation layer disposed in the display region and the second module region on the first inorganic thin film encapsulation layer, a second organic thin film encapsulation layer disposed in the first module region on the first inorganic thin film encapsulation layer, and a second inorganic thin film encapsulation layer disposed on the first and second organic thin film encapsulation layers.

In an exemplary embodiment, the scatterers may be disposed inside a portion of the first organic thin film encapsulation layer located in the second module region, and may be disposed inside the second organic thin film encapsulation layer.

In an exemplary embodiment, the first organic thin film encapsulation layer may be disposed on an outer side of the first partition structure, and the second organic thin film encapsulation layer may be disposed on an inner side of the first partition structure. In such an embodiment, a refractive index of the first organic thin film encapsulation layer located in the display region may be different from a refractive index of the first organic thin film encapsulation layer located in the second module region, and the refractive index of the first organic thin film encapsulation layer located in the display region may be different from a refractive index of the second organic thin film encapsulation layer.

In an exemplary embodiment, the display region may surround at least a portion of the first module region and at least a portion of the second module region.

In an exemplary embodiment, the organic light emitting diode display device may further include a second partition structure disposed at an outer periphery of the second module region on the substrate to surround the third pixel structure.

In an exemplary embodiment, the thin film encapsulation structure may include a first inorganic thin film encapsulation layer disposed on the first, second, and third pixel structures, the first partition structure and the second partition structure, a first organic thin film encapsulation layer disposed in the display region on the first inorganic thin film encapsulation layer, a second organic thin film encapsulation layer disposed in the first module region on the first inorganic thin film encapsulation layer, a third organic thin film encapsulation layer disposed in the second module region on the first inorganic thin film encapsulation layer, and a second inorganic thin film encapsulation layer disposed on the first, second, and third organic thin film encapsulation layers.

In an exemplary embodiment, the scatterers may be disposed inside the second organic thin film encapsulation layer, and may be disposed inside the third organic thin film encapsulation layer.

In an exemplary embodiment, the first organic thin film encapsulation layer may be disposed on an outer side of each of the first and second partition structures, and the second organic thin film encapsulation layer may be disposed on an inner side of the first partition structure. In such an embodiment, the third organic thin film encapsulation layer may be disposed on an inner side of the second partition structure, and a refractive index of the first organic thin film encapsulation layer may be different from a refractive index of the second organic thin film encapsulation layer. In such an embodiment, the refractive index of the first organic thin film encapsulation layer may be different from a refractive index of the third organic thin film encapsulation layer.

In an exemplary embodiment, each of the first and second functional modules may include at least one selected from a camera module, a face recognition sensor module, a pupil recognition sensor module, an acceleration sensor module, a proximity sensor module, an infrared sensor module, and an illuminance sensor module.

In exemplary embodiments of the invention, the organic light emitting diode display device includes the thin film encapsulation structure including the scatterers in the module region, so that the transmittance of the external light may be adjusted in the module region. Accordingly, in such embodiments of the organic light emitting diode display device, a refractive index of the thin film encapsulation structure located in the module region may be effectively adjusted according to the type of the functional module.

In exemplary embodiments of the invention, the organic light emitting diode display device includes the partition structure, the first organic thin film encapsulation layer, and the second organic thin film encapsulation layer, so that the first organic thin film encapsulation layer may be separated from the second organic thin film encapsulation layer to allow the scatterers to be located only inside the second organic thin film encapsulation layer. Accordingly, in such embodiments of the organic light emitting diode display device, the scatterers may be effectively prevented from leaking from the module region to the display region.

In exemplary embodiments of the invention, the organic light emitting diode display device includes the first partition structure, the second partition structure, the first organic thin film encapsulation layer, the second organic thin film encapsulation layer, and the third organic thin film encapsulation layer, so that the first organic thin film encapsulation layer may be separated from the second organic thin film encapsulation layer and the third organic thin film encapsulation layer to allow the scatterers to be located only inside each of the second organic thin film encapsulation layer and the third organic thin film encapsulation layer. Accordingly, in such embodiment of the organic light emitting diode display device, the scatterers may be effectively prevented from leaking from the first module region and the second module region to the display region.

BRIEF DESCRIPTION OF THE DRAWINGS

The above and other features of the invention will become more apparent by describing in further detail exemplary embodiments thereof with reference to the accompanying drawings, in which:

FIG. 6 is a partially enlarged plan view showing an exemplary embodiment of the first module region shown in FIG. 3;

FIG. 11 is a plan view showing an exemplary embodiment of a partition structure included in the organic light emitting diode display device of FIG. 9;

DETAILED DESCRIPTION

Figure 1:
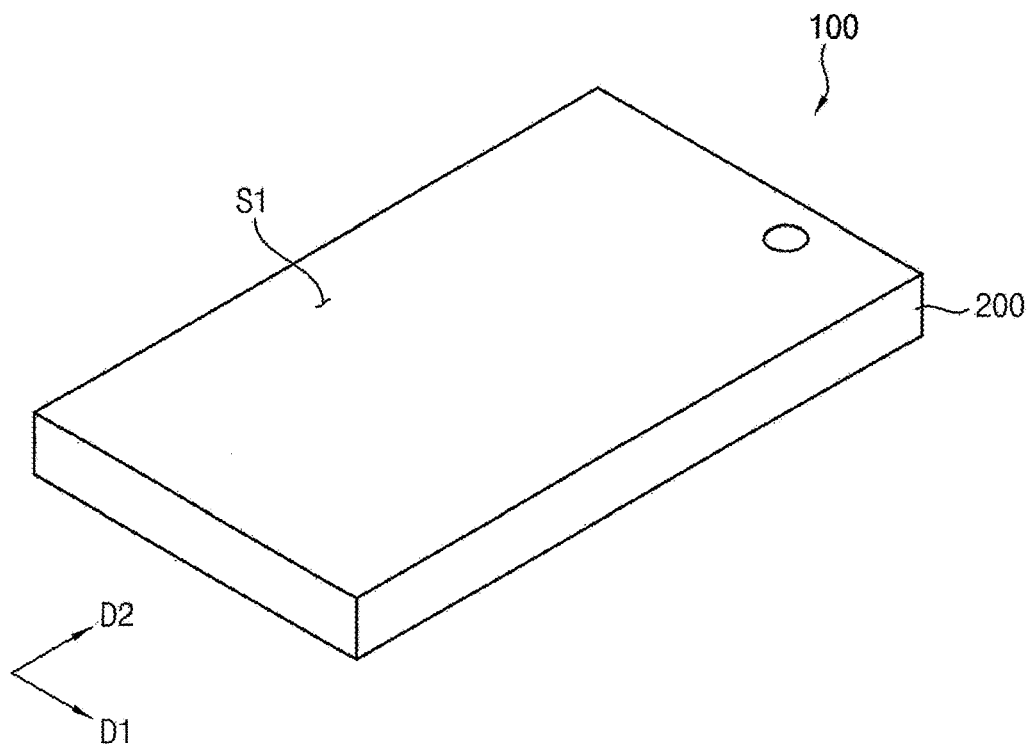
FIG. 1 is a perspective view showing an organic light emitting diode display device according to an exemplary embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, exemplary embodiments of an organic light emitting diode display device according to the invention will be described in detail with reference to the accompanying drawings. In the accompanying drawings, same or similar reference numerals refer to the same or similar elements.

Figure 2:
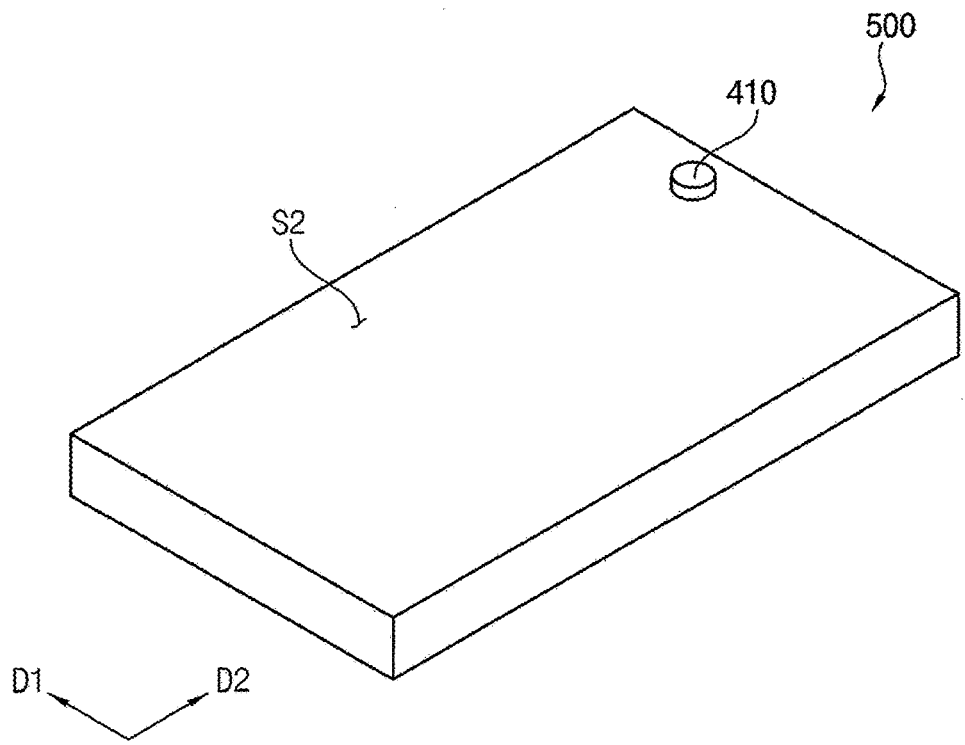
FIG. 2 is a perspective view showing a first functional module disposed on a rear surface of the organic light emitting diode display device of FIG. 1.
Figure 3:
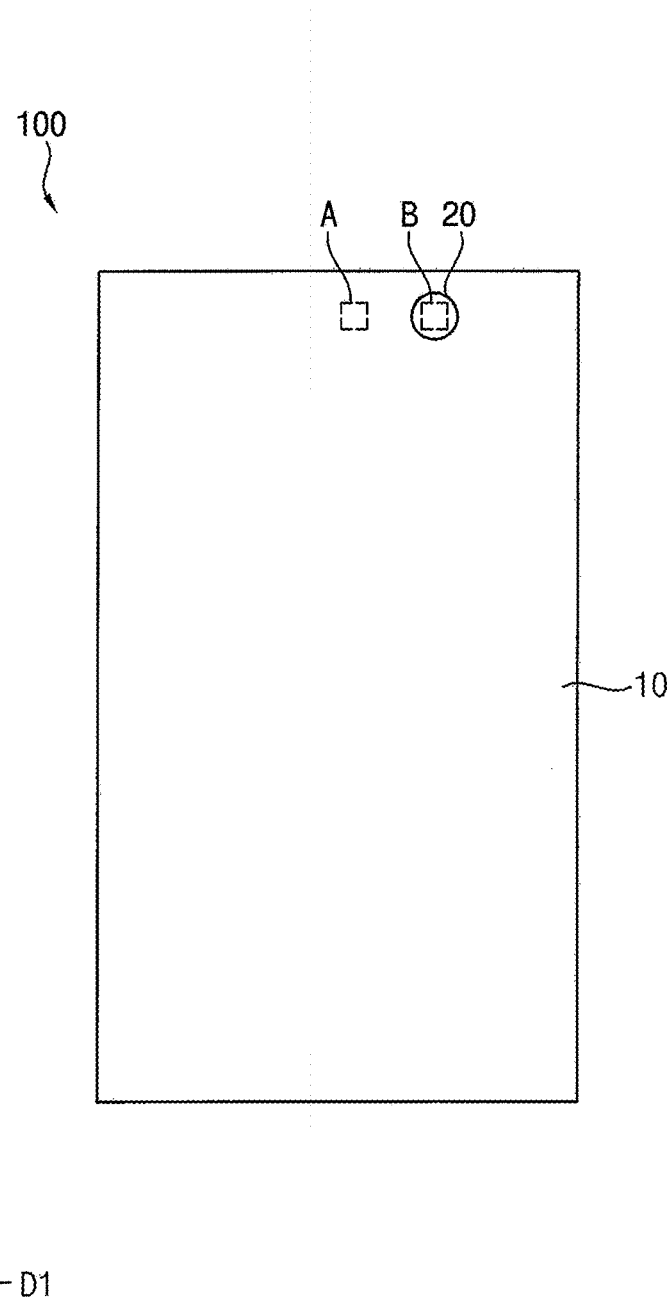
FIG. 3 is a plan view showing a display region and a first module region of the organic light emitting diode display device of FIG. 1.

FIG. 1 is a perspective view showing an organic light emitting diode display device according to an exemplary embodiment of the invention, FIG. 2 is a perspective view showing a first functional module disposed on a rear surface of the organic light emitting diode display device of FIG. 1, and FIG. 3 is a plan view showing a display region and a first module region of the organic light emitting diode display device of FIG. 1.

Referring to FIGS. 1, 2, and 3, an exemplary embodiment of an organic light emitting diode display device 100 may include a substrate 110 (see FIG. 7), a thin film encapsulation structure 450 (see FIG. 7), a functional module 410, and the like. The organic light emitting diode display device 100 may have a first surface S1 (e.g., a top surface of the thin film encapsulation structure 450) for displaying an image and a second surface S2 (e.g., a bottom surface of the substrate 110) opposite to the first surface S1. The functional module 410 may be located on one side portion, e.g., an upper side portion, of the bottom surface of the substrate 110.

In an exemplary embodiment, as shown in FIG. 3, the organic light emitting diode display device 100 may include a display region 10 and a module region 20. In such an embodiment, the display region 10 may surround at least a portion of the module region 20, and the functional module 410 may overlap the module region 20. In an exemplary embodiment, the display region 10 may completely surround the module region 20, and an area of the display region 10 may be greater than an area of the module region 20.

Figure 4:
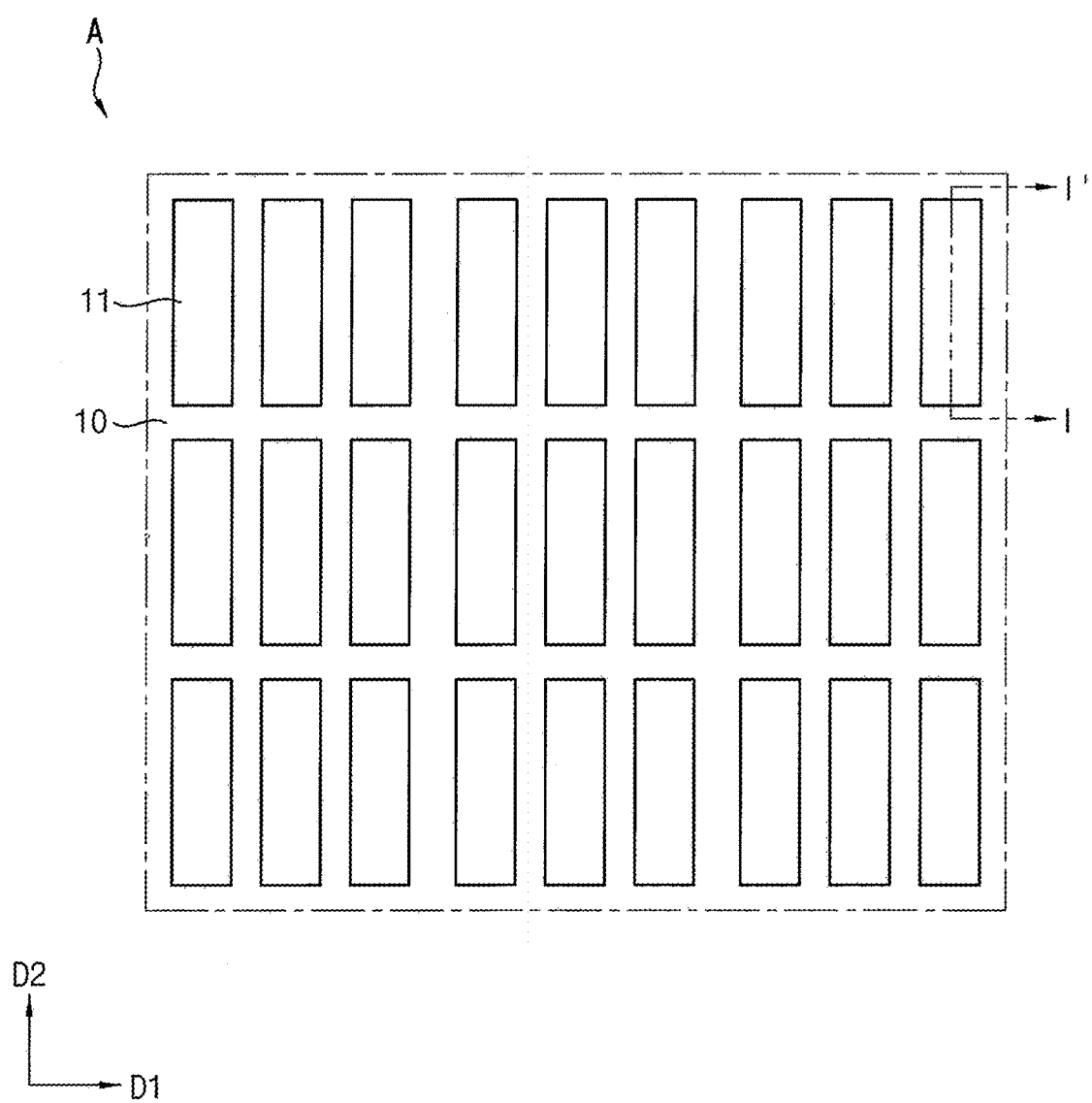
FIG. 4 is a partially enlarged plan view showing 'A' region of the display region shown in FIG. 3.
Figure 5:
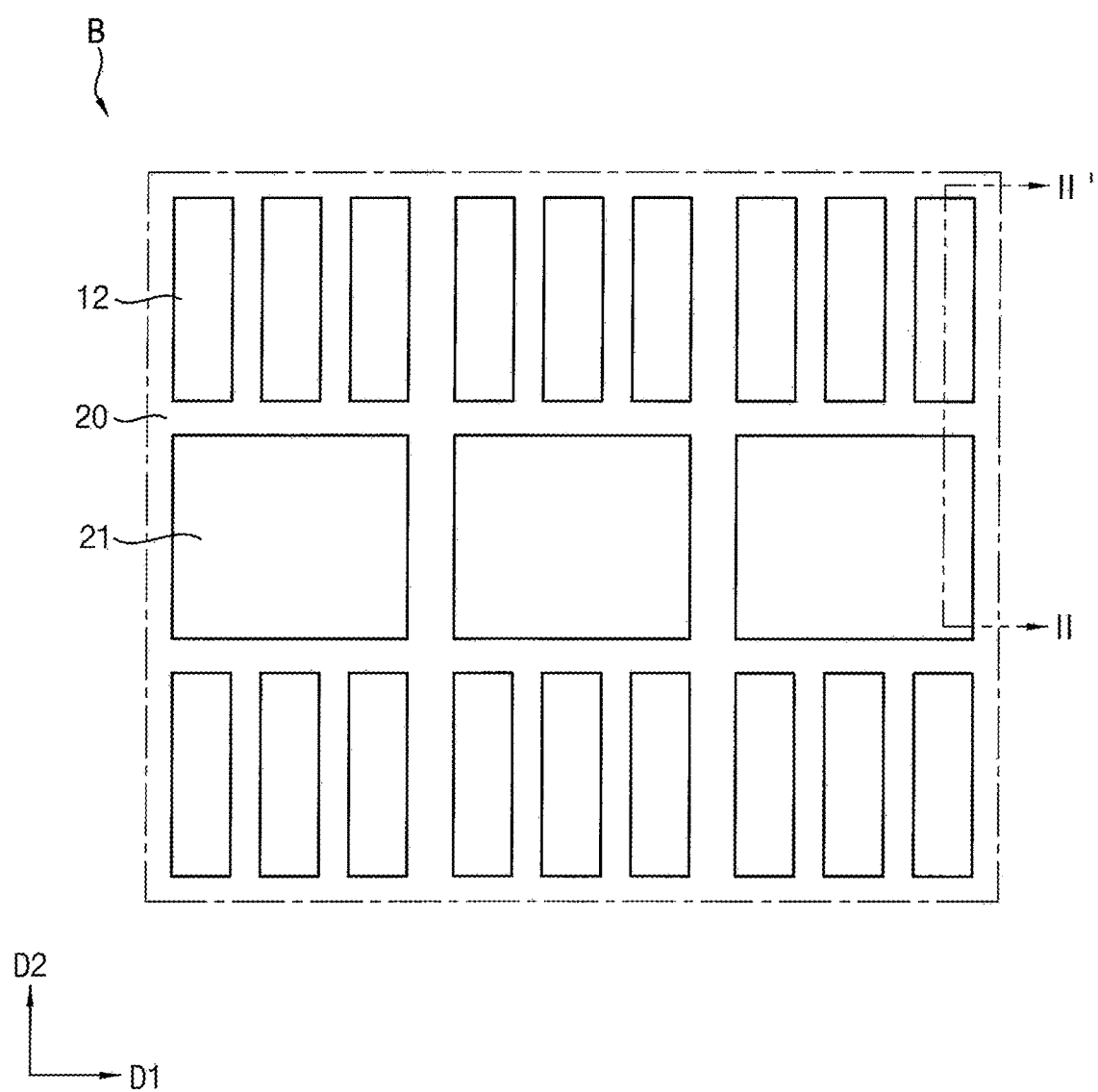
FIG. 5 is a partially enlarged plan view showing 'B' region of the first module region shown in FIG. 3.

The display region 10 may include a plurality of first pixel regions (e.g., corresponding to a first pixel region 11 of FIG. 4), and the module region 20 may include a plurality of second pixel regions and a plurality of transmissive regions (e.g., corresponding to a second pixel region 12 and a transmissive region 21 of FIG. 5). In such an embodiment, the thin film encapsulation structure 450 of the organic light emitting diode display device 100 includes scatterers 490 to have different refractive indexes in the display region 10 and the module region 20. In one embodiment, for example, external light may be incident on the first surface S1 of the organic light emitting diode display device 100, and the external light may pass through the thin film encapsulation structure 450. In such an embodiment, a transmittance of the external light passing through the thin film encapsulation structure 450 located in the display region 10 may be different from a transmittance of the external light passing through the thin film encapsulation structure 450 located in the module region 20. Accordingly, in such an embodiment, the transmittance of the external light may be adjusted according to a type of the functional module 410 located in the module region 20 on the bottom surface of the substrate 110.

In an exemplary embodiment, as described above, the functional module 410 may overlap the module region 20 on the bottom surface of the substrate 110. In such an embodiment, a size of the module region 20 may be substantially the same as a size of the functional module 410. In such an embodiment, a shape of the module region 20 may be defined to correspond to a shape of the functional module 410. The functional module 410 may include at least one selected from: a camera module for capturing (or recognizing) an image of an object which is located over the first surface S1 of the organic light emitting diode display device 100; a face recognition sensor module for detecting a face of a user; a pupil recognition sensor module for detecting a pupil of the user; an acceleration sensor module and a geomagnetic sensor module for determining a movement of the organic light emitting diode display device 100; a proximity sensor module and an infrared sensor module for detecting proximity with respect to a front side of the organic light emitting diode display device 100; and an illuminance sensor module for measuring a degree of brightness when left in a pocket or a bag.

Herein, for convenience of illustration and description, exemplary embodiments, where each of the module region 20 and the functional module 410 has a circular shape when viewed in a plan view, are shown and described, but the shape of each of the module region 20 and the functional module 410 is not limited thereto. Alternatively, the module region 20 may have a triangular shape, a rectangular shape, a rhombic shape, a polygonal shape, a track shape, or an elliptical shape, for example, when viewed in a plan view.

FIG. 4 is a partially enlarged plan view showing 'A' region of the display region shown in FIG. 3, FIG. 5 is a partially enlarged plan view showing 'B' region of the first module region shown in FIG. 3, and FIG. 6 is a partially enlarged plan view showing an exemplary embodiment of the first module region shown in FIG. 3.

Referring to FIGS. 4 and 5, in an exemplary embodiment, the display region 10 of the organic light emitting diode display device 100 may include a plurality of first pixel regions 11. In one exemplary embodiment, for example, the first pixel regions 11 may be arranged in the display region 10 along a first direction D1 parallel to a top surface of the substrate 110 and a second direction D2 perpendicular to the first direction D1. In such an embodiment, the first pixel regions 11 may be arranged over the display region 10.

Herein, for convenience of illustration and description, exemplary embodiments, where each of the display region 10 and the first pixel region 11 has a rectangular shape when viewed in a plan view are shown and described, but the shapes thereof are not limited thereto. Alternatively, each of the display region 10 and the first pixel region 11 may have a triangular shape, a rhombic shape, a polygonal shape, a circular shape, a track shape, or an elliptical shape, for example, when viewed in a plan view.

Herein, for convenience of illustration and description, exemplary embodiments, where the first pixel regions 11 are arranged in an RGB stripe scheme in which rectangles having the same size are sequentially arranged, are shown and described, but the configuration thereof is not limited thereto. Alternatively, the first pixel regions 11 may be arranged by using an S-stripe scheme including a blue organic light emitting diode having a relatively large area, a WRGB scheme further including a white organic light emitting diode, a PenTile scheme in which RG-GB patterns are repeatedly arranged, or the like, for example.

In an exemplary embodiment, the module region 20 of the organic light emitting diode display device 100 may include a plurality of second pixel regions 12 and a plurality of transmissive regions 21. In one exemplary embodiment, for example, the second pixel regions 12 may be arranged in the first direction D1 in the module region 20, and the transmissive regions 21 may be arranged in the first direction D1 in a row different from a row in which the second pixel regions 12 are arranged. In such an embodiment, the second pixel regions 12 and the transmissive regions 21 may be arranged over the module region 20. In an exemplary embodiment, compared to the first pixel regions 11 disposed in the display region 10 of FIG. 4, the module region 20 may include a relatively small number of pixel regions per unit area due to the transmissive regions 21. In such an embodiment, a resolution of the module region 20 may be lower than a resolution of the display region 10. In such an embodiment, the transmissive region 21 may be substantially transparent or have a lower light transmittance than that of the display region 10.

In an alternative exemplary embodiment, as shown in FIG. 6, the module region 20 may include a transmissive region 31 having a relatively large area. In such an embodiment, the module region 20 may include a relatively smaller number of pixel regions per unit area due to the transmissive region 31 having a relatively large area. In such an embodiment, even when the resolution of the module region 20 is relatively low, due to the transmissive region 31 having a relatively large area, the functional module 410 may relatively easily recognize an image of an object which is located over the first surface S1 of the organic light emitting diode display device 100.

Herein, for convenience of illustration and description, exemplary embodiments, where each of the second pixel region 12 and the transmissive region 21 has a rectangular shape when viewed in a plan view are shown and described, but the shapes are not limited thereto. Alternatively, each of the second pixel region 12 and the transmissive region 21 may have a triangular shape, a rhombic shape, a polygonal shape, a circular shape, a track shape, or an elliptical shape, for example, when viewed in a plan view.

Herein, for convenience of illustration and description, exemplary embodiments, where the second pixel regions 12 are arranged in the RGB stripe scheme, but the configuration thereof is not limited thereto. Alternatively, the second pixel regions 12 may be arranged by using the S-stripe scheme, the WRGB scheme, the PenTile scheme, or the like, for example.

Figure 7:
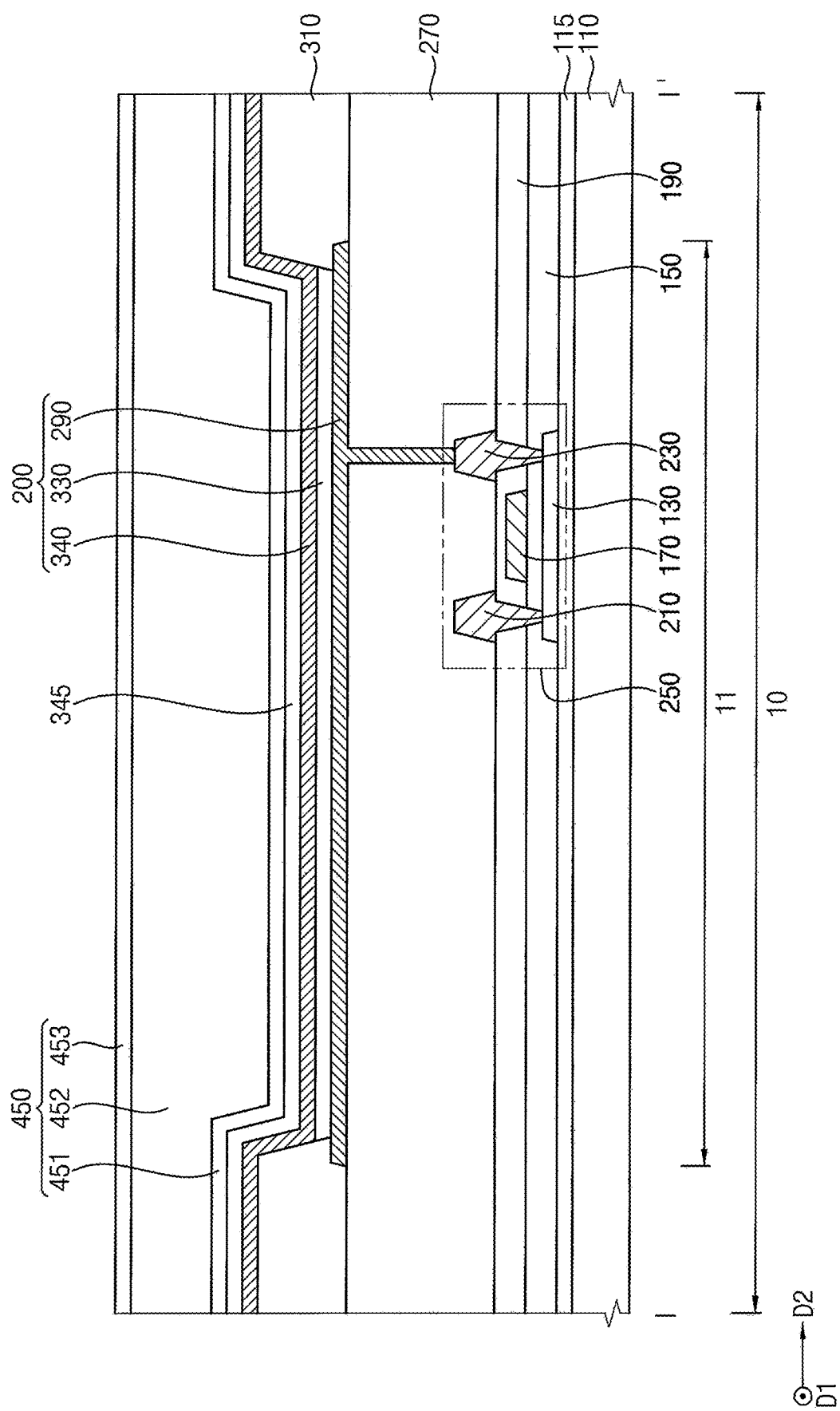
FIG. 7 is a cross-sectional view taken along line I-I' of FIG. 4.
Figure 8:
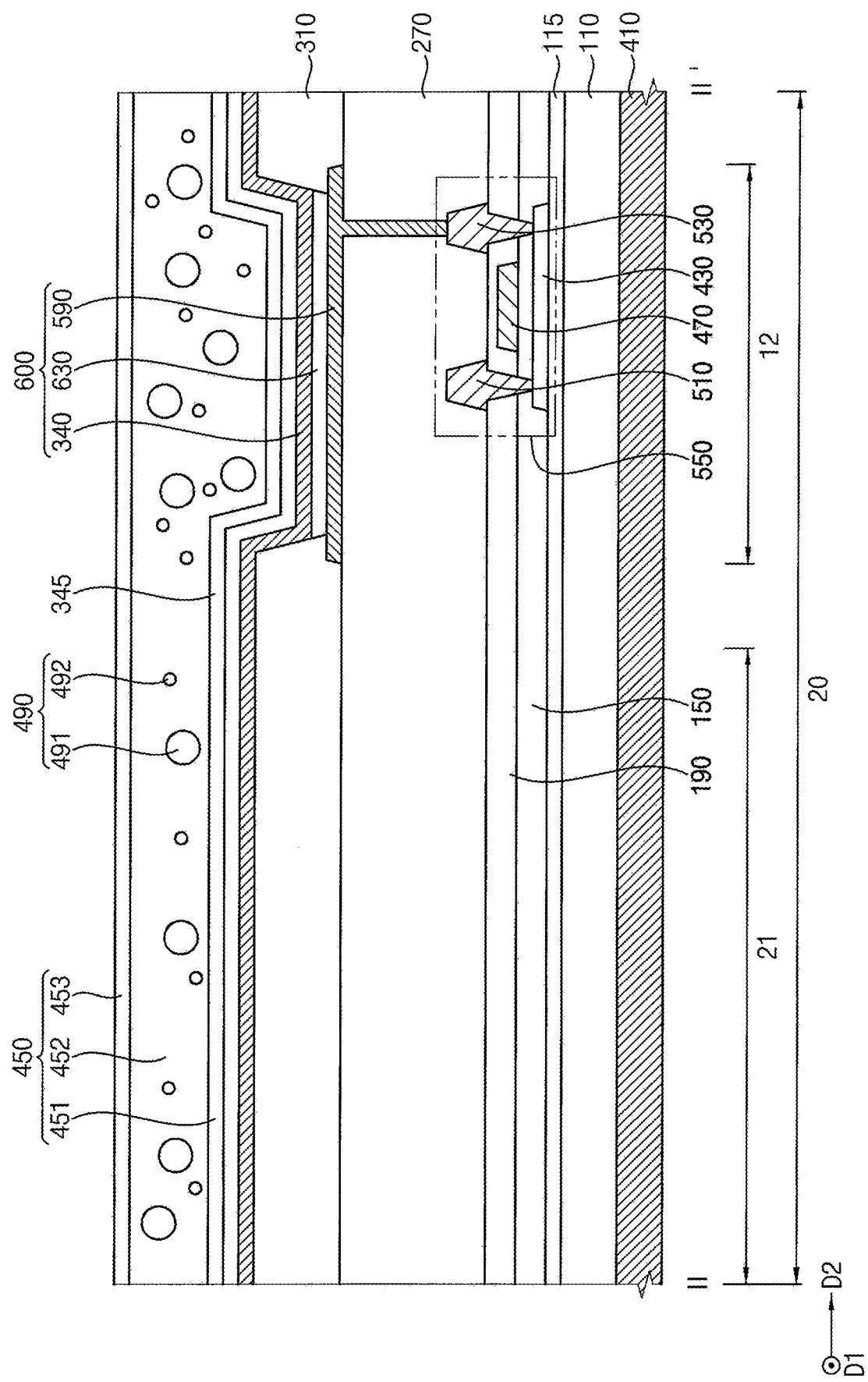
FIG. 8 is a cross-sectional view taken along line II-IF of FIG. 5.

FIG. 7 is a cross-sectional view taken along line I-I' of FIG. 4, and FIG. 8 is a cross-sectional view taken along line II-IF of FIG. 5.

Referring to FIGS. 7 and 8, an exemplary embodiment of the organic light emitting diode display device 100 may include a substrate 110, a buffer layer 115, a first semiconductor element 250, a second semiconductor element 550, a gate insulating layer 150, an insulating interlayer 190, a planarization layer 270, a pixel defining layer 310, a first pixel structure 200, a second pixel structure 600, a capping layer 345, a thin film encapsulation structure 450, a functional module 410, and the like. The organic light emitting diode display device 100 includes a display region 10 including a first pixel region 11, and a module region 20 including a second pixel region 12 and a transmissive region 21, so that the substrate 110 may be divided into the display region 10 including the first pixel region 11, and the module region 20 including the second pixel region 12 and the transmissive region 21. The first pixel structure 200 is disposed in the display region 10, and the second pixel structure 600 is disposed in the module region 20, so that an image may be displayed in the display region 10 and the module region 20. In such an embodiment, the module region 20 includes the transmissive region 21, so that external light may be incident on the functional module 410 through the transmissive region 21.

In an exemplary embodiment, as shown in FIGS. 7 and 8, the first semiconductor element 250 may include a first active layer 130, a first gate electrode 170, a first source electrode 210, and a first drain electrode 230, and the second semiconductor element 550 may include a second active layer 430, a second gate electrode 470, a second source electrode 510, and a second drain electrode 530. In such an embodiment, the first pixel structure 200 may include a first lower electrode 290, a first light emitting layer 330, and an upper electrode 340, and the second pixel structure 600 may include a second lower electrode 590, a second light emitting layer 630, and an upper electrode 340. In such an embodiment, the thin film encapsulation structure 450 may include a first inorganic thin film encapsulation layer 451, an organic thin film encapsulation layer 452, and a second inorganic thin film encapsulation layer 453. In an exemplary embodiment, the thin film encapsulation structure 450 located in the module region 20 may include a plurality of scatterers 490, and the scatterers 490 may include high refractive scatterers 491 and low refractive scatterers 492.

The substrate 110 may include a transparent or opaque material. The substrate 110 may be a transparent resin substrate. In one exemplary embodiment, for example, the transparent resin substrate may include a polyimide substrate. In one exemplary embodiment, for example, the substrate 110 may have a configuration in which a first organic layer, a first barrier layer, a second organic layer, and a second barrier layer are sequentially stacked. The first barrier layer and the second barrier layer may include an inorganic material such as silicon oxide. In such an embodiment, the first organic layer and the second organic layer may include an organic material such as a polyimide-based resin. In one exemplary embodiment, for example, each of the first and second barrier layers may block moisture penetrating through the first and second organic layers.

In an exemplary embodiment of a method of manufacturing the organic light emitting diode display device 100, the substrate 110 is thin and flexible, so that the substrate 110 may be formed on a rigid glass substrate to support the formation of an upper structure (e.g., the first and second semiconductor elements 250 and 550, the first and second pixel structures 200 and 600, and the thin film encapsulation structure 450). In one exemplary embodiment, for example, after the buffer layer 115 is disposed on the second barrier layer, the upper structure may be formed on the buffer layer 115. After the upper structure is formed, the glass substrate may be removed. In such an embodiment, due to flexible physical properties of the substrate 110, it may be difficult to directly form the upper structure on the substrate 110. Considering the flexible physical properties of the substrate 110, the upper structure is formed by using a rigid glass substrate, and then the glass substrate is removed, so that the first organic layer, the first barrier layer, the second organic layer, and the second barrier layer may be used as the substrate 110. In an exemplary embodiment, the substrate 110 may include at least one selected from a quartz substrate, a synthetic quartz substrate, a calcium fluoride substrate, a fluorine-doped quartz substrate (F-doped quartz substrate), a soda lime glass substrate, a non-alkali glass substrate, and the like.

In an alternative exemplary embodiment, a lower protective film may be disposed on the bottom surface of the substrate 110. The lower protective film may protect the substrate 110, and an opening overlapping the module region 20 may be defined through the lower protective film. The functional module 410 may be located in the opening. In one exemplary embodiment, for example, the lower protective film may include at least one material selected from polyethylene terephthalate ("PET"), polyethylene naphthalene ("PEN"), polypropylene ("PP"), polycarbonate ("PC"), polystyrene ("PS"), polysulfone ("Psul"), polyethylene ("PE"), polyphthalamide ("PPA"), polyether sulfone ("PES"), polyarylate ("PAR"), polycarbonate oxide ("PCO"), modified polyphenylene oxide ("MPPO"), and the like The buffer layer 115 may be disposed on the substrate 110. The buffer layer 115 may be disposed over the substrate 110. The buffer layer 115 may effectively prevent metal atoms or impurities from diffusing through the substrate 110 into the upper structure. In an exemplary embodiment, where a surface of the substrate 110 is not uniform, the buffer layer 115 may serve to improve flatness of the surface of the substrate 110. Depending on a type of the substrate 110, at least two buffer layers may be provided on the substrate 110, or the buffer layer may be omitted. In one exemplary embodiment, for example, the buffer layer 115 may include an organic material or an inorganic material. In an alternative exemplary embodiment, the buffer layer 115 may not be disposed in the transmissive region 21 of the module region 20. In such an embodiment, an opening which exposes the top surface of the substrate 110 located in the transmissive region 21 may be defined through the buffer layer 115.

The first active layer 130 and the second active layer 430 may be disposed on the buffer layer 115. In one exemplary embodiment, for example, the first active layer 130 may be disposed in the first pixel region 11 of the display region 10 on the substrate 110, and the second active layer 430 may be disposed in the second pixel region 12 of the module region 20 on the substrate 110. Each of the first and second active layers 130 and 430 may include a metal oxide semiconductor, an inorganic semiconductor (e.g., amorphous silicon or poly silicon semiconductor), an organic semiconductor, or the like. Each of the first and second active layers 130 and 430 may have a source region and a drain region.

The gate insulating layer 150 may be disposed on the buffer layer 115 and the first and second active layers 130 and 430. In an alternative exemplary embodiment, the gate insulating layer 150 may not be disposed in the transmissive region 21. In such an embodiment, an opening which exposes the top surface of the substrate 110 located in the transmissive region 21 may be defined through the gate insulating layer 150. The opening of the gate insulating layer 150 may overlap the opening of the buffer layer 115.

The gate insulating layer 150 may sufficiently cover the first and second active layers 130 and 430 on the buffer layer 115, and may have a substantially flat top surface without forming a step structure around the first and second active layers 130 and 430. Alternatively, the gate insulating layer 150 may be disposed along a profile of the first and second active layers 130 and 430 with a uniform thickness to cover the first and second active layers 130 and 430 on the buffer layer 115. In an exemplary embodiment, the gate insulating layer 150 may have a multilayer structure including a plurality of insulating layers. In one exemplary embodiment, for example, the insulating layers may have different thicknesses from each other or may include different materials from each other.

The first gate electrode 170 and the second gate electrode 470 may be disposed on the gate insulating layer 150. In one exemplary embodiment, for example, the first gate electrode 170 may be disposed on a portion of the gate insulating layer 150 under which the first active layer 130 is located, and the second gate electrode 470 may be disposed on a portion of the gate insulating layer 150 under which the second active layer 430 is located. Each of the first and second gate electrodes 170 and 470 may include at least one material selected from a metal, an alloy, metal nitride, conductive metal oxide, a transparent conductive material, and the like. In one exemplary embodiment, for example, each of the first and second gate electrodes 170 and 470 may include at least one material selected from gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide ("ITO"), tin oxide ($SnO_x$), indium oxide ($InO_x$), gallium oxide ($GaO_x$), indium zinc oxide ("IZO"), and the like. These materials may be used alone or in combination with each other. In an exemplary embodiment, each of the first and second gate electrodes 170 and 470 may have a multilayer structure including a plurality of metal layers. In one exemplary embodiment, for example, the metal layers may have different thicknesses from each other or may include different materials from each other.

The insulating interlayer 190 may be disposed on the gate insulating layer 150 and the first and second gate electrodes 170 and 470. In an alternative exemplary embodiment, the insulating interlayer 190 may not be disposed in the transmissive region 21. In such an embodiment, an opening which exposes the top surface of the substrate 110 located in the transmissive region 21 may be defined through the insulating interlayer 190. The opening of the insulating interlayer 190 may overlap the opening of the buffer layer 115 and the opening of the gate insulating layer 150.

The insulating interlayer 190 may sufficiently cover the first and second gate electrodes 170 and 470 on the gate insulating layer 150, and may have a substantially flat top surface without forming a step structure around the first and second gate electrodes 170 and 470. Alternatively, the insulating interlayer 190 may be disposed along a profile of the first and second gate electrodes 170 and 470 with a uniform thickness to cover the first and second gate electrodes 170 and 470 on the gate insulating layer 150. The insulating interlayer 190 may include at least one material selected from a silicon compound, metal oxide, and the like. In an exemplary embodiment, the insulating interlayer 190 may have a multilayer structure including a plurality of insulating layers. In one exemplary embodiment, for example, the insulating layers may have different thicknesses from each other or may include different materials from each other.

The first source electrode 210, the first drain electrode 230, the second source electrode 510, and the second drain electrode 530 may be disposed on the insulating interlayer 190. In an exemplary embodiment, the first source electrode 210 may be connected to the source region of the first active layer 130 through a contact hole formed by removing first portions of the gate insulating layer 150 and the insulating interlayer 190, and the first drain electrode 230 may be connected to the drain region of the first active layer 130 through a contact hole formed by removing second portions of the gate insulating layer 150 and the insulating interlayer 190. In such an embodiment, the second source electrode 510 may be connected to the source region of the second active layer 430 through a contact hole formed by removing third portions of the gate insulating layer 150 and the insulating interlayer 190, and the second drain electrode 530 may be connected to the drain region of the second active layer 430 through a contact hole formed by removing fourth portions of the gate insulating layer 150 and the insulating interlayer 190.

Each of the first and second source electrodes 210 and 510 and the first and second drain electrodes 230 and 530 may include at least one material selected from a metal, an alloy, metal nitride, conductive metal oxide, a transparent conductive material, and the like. These may be used alone or in combination with each other. In an exemplary embodiment, each of the first and second source electrodes 210 and 510 and the first and second drain electrodes 230 and 530 may have a multilayer structure including a plurality of metal layers. In one exemplary embodiment, for example, the metal layers may have different thicknesses from each other or may include different materials from each other.

Accordingly, the first semiconductor element 250 including the first active layer 130, the first gate electrode 170, the first source electrode 210, and the first drain electrode 230 may be provided, and the second semiconductor element 550 including the second active layer 430, the second gate electrode 470, the second source electrode 510, and the second drain electrode 530 may be provided.

Herein, for convenience of illustration and description, exemplary embodiments, where each of the first and second semiconductor elements 250 and 550 has a top gate structure are shown and described, but the configuration thereof is not limited thereto. In one alternative exemplary embodiment, for example, each of the first and second semiconductor elements 250 and 550 may have a bottom gate structure and/or a double gate structure.

Although only the first semiconductor element 250 is shown in FIG. 7, other elements, e.g., at least one semiconductor element and at least one storage capacitor, may be disposed on the substrate 110 when viewed in other cross-sectional views of the first pixel region 11 of FIG. 4. Similarly, although only the second semiconductor element 550 has been shown in FIG. 8, other elements, e.g., at least one semiconductor element and at least one storage capacitor, may be disposed on the substrate 110 when viewed in other cross-sectional views of the second pixel region 12 of FIG. 5.

The planarization layer 270 may be disposed on the insulating interlayer 190 and the first and second semiconductor elements 250 and 550, and first and second contact holes which expose a portion of the first drain electrode 230 and a portion of the second drain electrode 530, respectively, may be defined through the planarization layer 270. In an alternative exemplary embodiment, an opening which exposes the top surface of the substrate 110 located in the transmissive region 21 may be defined through the planarization layer 270, and the opening of the planarization layer 270 may overlap the opening of the buffer layer 115, the opening of the gate insulating layer 150, and the opening of the insulating interlayer 190.

In an exemplary embodiment, the planarization layer 270 may have a relatively thick thickness to sufficiently cover the first and second semiconductor elements 250 and 550. In such an embodiment, the planarization layer 270 may have a substantially flat top surface. In an exemplary embodiment, a planarization process may be additionally performed on the planarization layer 270 to provide such a flat top surface of the planarization layer 270. The planarization layer 270 may include an organic material, an inorganic material, or the like. In the exemplary embodiment shown in FIGS. 7 and 8, the planarization layer 270 may include the organic material.

The first lower electrode 290 and the second lower electrode 590 may be disposed on the planarization layer 270. In one exemplary embodiment, for example, the first lower electrode 290 may be disposed in the first pixel region 11 on the planarization layer 270, may be in direct contact with the first drain electrode 230 through the first contact hole of the planarization layer 270, and may be electrically connected to the first semiconductor element 250. In such an embodiment, the second lower electrode 590 may be disposed in the second pixel region 12 on the planarization layer 270, may be in direct contact with the second drain electrode 530 through the second contact hole of the planarization layer 270, and may be electrically connected to the second semiconductor element 550.

Each of the first and second lower electrodes 290 and 590 may include at least one material selected from a metal, an alloy, metal nitride, conductive metal oxide, a transparent conductive material, and the like. These materials may be used alone or in combination with each other. In an exemplary embodiment, each of the first and second lower electrodes 290 and 590 may have a multilayer structure including a plurality of metal layers. In one exemplary embodiment, for example, the metal layers may have different thicknesses from each other or may include different materials from each other.

The pixel defining layer 310 may be disposed on a portion of each of the first and second lower electrodes 290 and 590 and the planarization layer 270. The pixel defining layer 310 may cover both sides of each of the first and second lower electrodes 290 and 590, and an opening which exposes a portion of a top surface of each of first, second, and third lower electrodes 290, 590, and 890 may be defined through the pixel defining layer 310.

In an alternative embodiment, an opening which exposes the top surface of the substrate 110 located in the transmissive region 21 may be defined through the pixel defining layer 310, and the opening of the pixel defining layer 310 may overlap the opening of the planarization layer 270, the opening of the insulating interlayer 190, the opening of the gate insulating layer 150, and the opening of the buffer layer 115. In one exemplary embodiment, for example, the openings may be defined as transmissive windows. In such an embodiment, a light transmittance may be relatively increased in the transmissive region 21. The pixel defining layer 310 may include or be formed of an organic material or an inorganic material. In the exemplary embodiment shown in FIGS. 7 and 8, the pixel defining layer 310 may include the organic material.

The first light emitting layer 330 may be disposed on the first lower electrode 290 exposed by the pixel defining layer 310, and the second light emitting layer 630 may be disposed on the second lower electrode 590 exposed by the pixel defining layer 310. Each of the first and second light emitting layers 330 and 630 may be formed by using at least one of light emitting materials for emitting different color lights (i.e., red light, green light, blue light, and the like) according to pixels. Alternatively, each of the first and second light emitting layers 330 and 630 may be formed by stacking a plurality of light emitting materials for generating different color lights such as red light, green light, and blue light to emit white light as a whole. In such an embodiment, a color filter may be disposed on each of the first and second light emitting layers 330 and 630 (e.g., to overlap each of the first and second light emitting layers 330 and 630 on the top surface of the thin film encapsulation structure 450). The color filter may include at least one selected from a red color filter, a green color filter, and a blue color filter. In an alternative exemplary embodiment, the color filter may include a yellow color filter, a cyan color filter, and a magenta color filter. The color filter may include a photosensitive resin or a color photoresist.

The upper electrode 340 may be disposed on the pixel defining layer 310 and the first and second light emitting layers 330 and 630. In an exemplary embodiment, the upper electrode 340 may be disposed over the substrate 110, and the first pixel structure 200 and the second pixel structure 600 may commonly include (or share) the upper electrode 340. In an alternative exemplary embodiment, the upper electrode 340 may not be disposed in the transmissive region 21. In such an embodiment, the light transmittance may be relatively increased in the transmissive region 21.

The upper electrode 340 may include at least one material selected from a metal, an alloy, metal nitride, conductive metal oxide, a transparent conductive material, and the like. These materials may be used alone or in combination with each other. In an exemplary embodiment, the upper electrode 340 may have a multilayer structure including a plurality of metal layers. In one exemplary embodiment, for example, the metal layers may have different thicknesses from each other or may include different materials from each other.

Accordingly, the first pixel structure 200 including the first lower electrode 290, the first light emitting layer 330, and the upper electrode 340 and the second pixel structure 600 including the second lower electrode 590, the second light emitting layer 630, and the upper electrode 340 may be provided.

The capping layer 345 may be disposed on the upper electrode 340. In an exemplary embodiment, the capping layer 345 may be disposed over the substrate 110. In an alternative exemplary embodiment, the capping layer 345 may not be disposed in the transmissive region 21. The capping layer 345 may protect the first and second pixel structures 200 and 600, and may be disposed to adjust refractive indexes and reflectances. The capping layer 345 may include an organic material or an inorganic material. In an exemplary embodiment, the capping layer 345 may include an organic material such as a triamine derivative, an arylenediamine derivative, 4,4'-N,N'-dicarbazole-biphenyl (4,4'-bis(N-carbazolyl)-1,1'-biphenyl; "CBP"), and tris-8-hydroxyquinoline aluminum ("Alq3").

In an alternative exemplary embodiment, an additional capping layer may be disposed on the capping layer 345. The additional capping layer may include a material different from the material of the capping layer 345. In one exemplary embodiment, for example, the additional capping layer may include at least one material selected from lithium fluoride (LiF), magnesium fluoride (MgF), aluminum fluoride (AlF), sodium fluoride (NaF), aluminum oxide (AlO), and the like.

The first inorganic thin film encapsulation layer 451 may be disposed on the capping layer 345. The first inorganic thin film encapsulation layer 451 may be disposed along a profile of the capping layer 345 with a uniform thickness to cover the capping layer 345. In one exemplary embodiment, for example, the first inorganic thin film encapsulation layer 451 may be disposed at an outermost portion of the organic light emitting diode display device 100, and the buffer layer 115 and the first inorganic thin film encapsulation layer 451 may be in direct contact with each other at the outermost portion. In such an embodiment, the first inorganic thin film encapsulation layer 451 and the buffer layer 115 may prevent the first and second pixel structures 200 and 600 from being deteriorated due to penetration of moisture, oxygen, and the like. In such an embodiment, the first inorganic thin film encapsulation layer 451 may function to protect the first and second pixel structures 200 and 600 from an external impact. The first inorganic thin film encapsulation layer 451 may include an inorganic material having flexibility. In one exemplary embodiment, for example, the first inorganic thin film encapsulation layer 451 may include at least one material selected from a silicon compound, metal oxide, and the like. In one exemplary embodiment, for example, the first inorganic thin film encapsulation layer 451 may include at least one material selected from silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), and the like. In an exemplary embodiment, the first inorganic thin film encapsulation layer 451 may be formed by using SiON.

The organic thin film encapsulation layer 452 may be disposed on the first inorganic thin film encapsulation layer 451. The organic thin film encapsulation layer 452 may be disposed on the first inorganic thin film encapsulation layer 451 with a relatively thick thickness, and may have a substantially flat top surface.

In an exemplary embodiment, as shown in FIG. 8, the scatterers 490 may be located inside the organic thin film encapsulation layer 452 located in the module region 20. In such an embodiment, as shown in FIG. 7, the scatterers 490 are not located inside the organic thin film encapsulation layer 452 located in the display region 10. In such an embodiment, a refractive index of the organic thin film encapsulation layer 452 located in the display region 10 may be different from a refractive index of the organic thin film encapsulation layer 452 located in the module region 20.

In one exemplary embodiment, for example, a portion of the external light incident on the top surface of the thin film encapsulation structure 450 may be transmitted through the transmissive region 21 of the module region 20. In such an embodiment, the transmitted external light may be incident on the functional module 410. In such an embodiment, the refractive index of the organic thin film encapsulation layer 452 may be approximately 1.5. When the refractive index of the organic thin film encapsulation layer 452 is approximately 1.5, a transmittance of visible light may be a relatively high value, whereas a transmittance of infrared light may be a relatively low value. In one exemplary embodiment, for example, where the functional module 410 is a module using the visible light (e.g., the camera module), the organic thin film encapsulation layer 452 may be formed by adjusting a ratio (or density, a size, etc.) of the high refractive scatterer 491 and the low refractive scatterer 492 in a way such that the transmittance of the visible light is a maximum value (e.g., a refractive index between approximately 1.5 and 1.6). Alternatively, where the functional module 410 is a module using the infrared light (e.g., the face recognition sensor module, the pupil recognition sensor module, the proximity sensor module, the infrared sensor module, etc.), the organic thin film encapsulation layer 452 may be formed by adjusting the ratio of the high refractive scatterer 491 and the low refractive scatterer 492 in a way such that the transmittance of the infrared light is a maximum value (e.g., a refractive index between approximately 1 and 1.3).

An organic thin film encapsulation layer included in a conventional organic light emitting diode display device does not include the scatterers 490. In such a conventional organic light emitting diode display device, the organic thin film encapsulation layer may have a refractive index of approximately 1.5. When the conventional organic light emitting diode display device includes a camera module and an infrared module, the camera module may normally operate because the transmittance of the visible light according to a refractive index of the organic thin film encapsulation layer is relatively high, whereas the infrared sensor may abnormally operate because the transmittance of the infrared light according to the refractive index of the organic thin film encapsulation layer is relatively low.

The organic thin film encapsulation layer 452 may improve flatness of the organic light emitting diode display device 100, and may protect the first and second pixel structures 200 and 600. The organic thin film encapsulation layer 452 may include an organic material having flexibility. In one exemplary embodiment, for example, the organic thin film encapsulation layer 452 may include at least one material selected from a photoresist, a polyacryl-based resin, a polyimide-based resin, a polyamide-based resin, a siloxane-based resin, an acryl-based resin, an epoxy-based resin, and the like. In one exemplary embodiment, for example, the scatterers 490 may include at least one material selected from silica powder, crystalline silicon, polycrystalline silicon, amorphous silicon, SiN, GaP, GaAs, TiO, AlSb, AlAs, AlGaAs, AlGaInP, BP, ZnGeP, SiO, PMMA, a photoresist, and the like.

The second inorganic thin film encapsulation layer 453 may be disposed on the organic thin film encapsulation layer 452. The second inorganic thin film encapsulation layer 453 may be disposed along a profile of the organic thin film encapsulation layer 452 with a uniform thickness to cover the organic thin film encapsulation layer 452. In one exemplary embodiment, for example, the second inorganic thin film encapsulation layer 453 may be disposed at an outermost portion of the organic light emitting diode display device 100, and the first inorganic thin film encapsulation layer 451 and the second inorganic thin film encapsulation layer 453 may be in direct contact with each other at the outermost portion. In such an embodiment, the second inorganic thin film encapsulation layer 453 may prevent the first and second pixel structures 200 and 600 from being deteriorated due to the penetration of moisture, oxygen, and the like together with the buffer layer 115 and the first inorganic thin film encapsulation layer 451. In such an embodiment, the second inorganic thin film encapsulation layer 453 may function to protect the first and second pixel structures 200 and 600 from an external impact together with the first inorganic thin film encapsulation layer 451 and the organic thin film encapsulation layer 452. The second inorganic thin film encapsulation layer 453 may include an inorganic material having flexibility. In one exemplary embodiment, for example, the second inorganic thin film encapsulation layer 453 may include at least one selected from $SiO_x$, $SiN_x$, $SiO_xN_y$, $SiO_xC_y$, $SiC_xN_y$, $AlO_x$, $AlN_x$, $TaO_x$, $HfO_x$, $ZrO_x$, $TiO_x$, and the like. In an exemplary embodiment, the second inorganic thin film encapsulation layer 453 may be formed by using SiN. In an exemplary embodiment, a thickness of the second inorganic thin film encapsulation layer 453 may be relatively thinner than a thickness of the first inorganic thin film encapsulation layer 451.

Accordingly, the thin film encapsulation structure 450 including the first inorganic thin film encapsulation layer 451, the organic thin film encapsulation layer 452, and the second inorganic thin film encapsulation layer 453 may be provided.

The functional module 410 may be disposed in the module region 20 on the bottom surface of the substrate 110.

As described above, a portion of the external light incident on the top surface of the thin film encapsulation structure 450 may be incident on the functional module 410 through the transmissive regions 21 located in the module region 20, and the functional module 410 may operate through the incident external light. The functional module 410 may include at least one selected from a camera module, a face recognition sensor module, a pupil recognition sensor module, an acceleration sensor module, a geomagnetic sensor module, a proximity sensor module, an infrared sensor module, an illuminance sensor module, and the like.

In an exemplary embodiment of the invention, the organic light emitting diode display device 100 includes the thin film encapsulation structure 450 including the scatterers 490 in the module region 20, so that the transmittance of the external light may be adjusted in the module region 20. Accordingly, in such an embodiment of the organic light emitting diode display device 100, a refractive index of the thin film encapsulation structure 450 located in the module region 20 may be effectively adjusted according to the type of the functional module 410.

Figure 9:
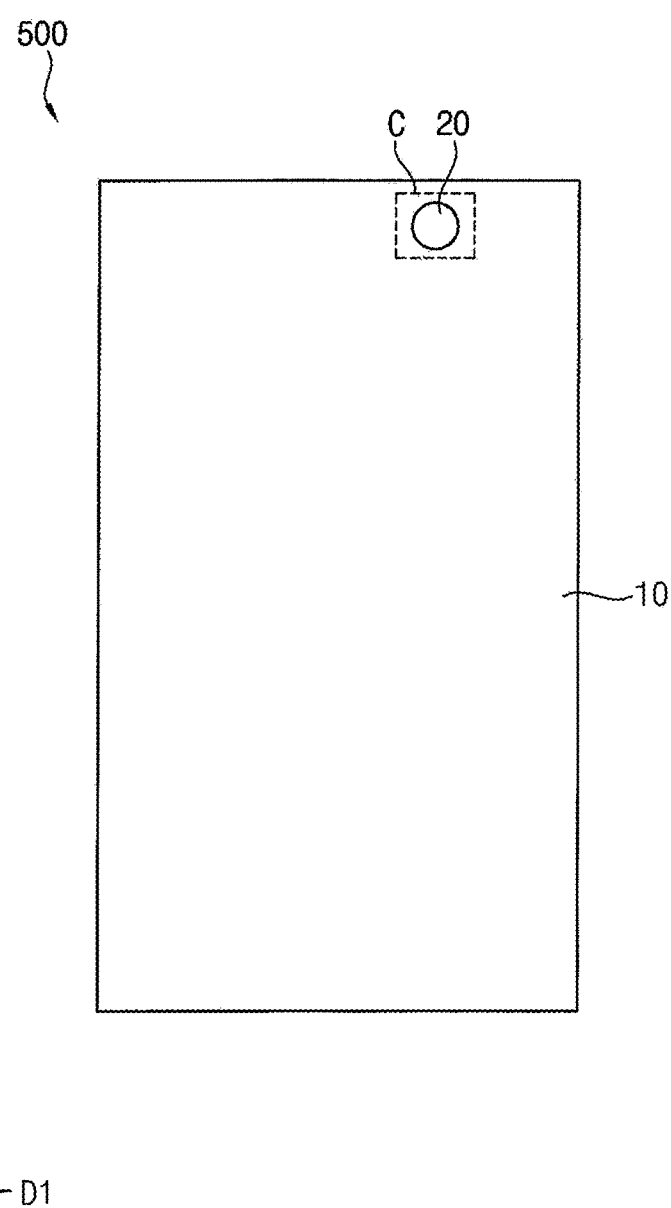
FIG. 9 is a plan view showing an organic light emitting diode display device according to an alternative exemplary embodiment of the invention.
Figure 10:
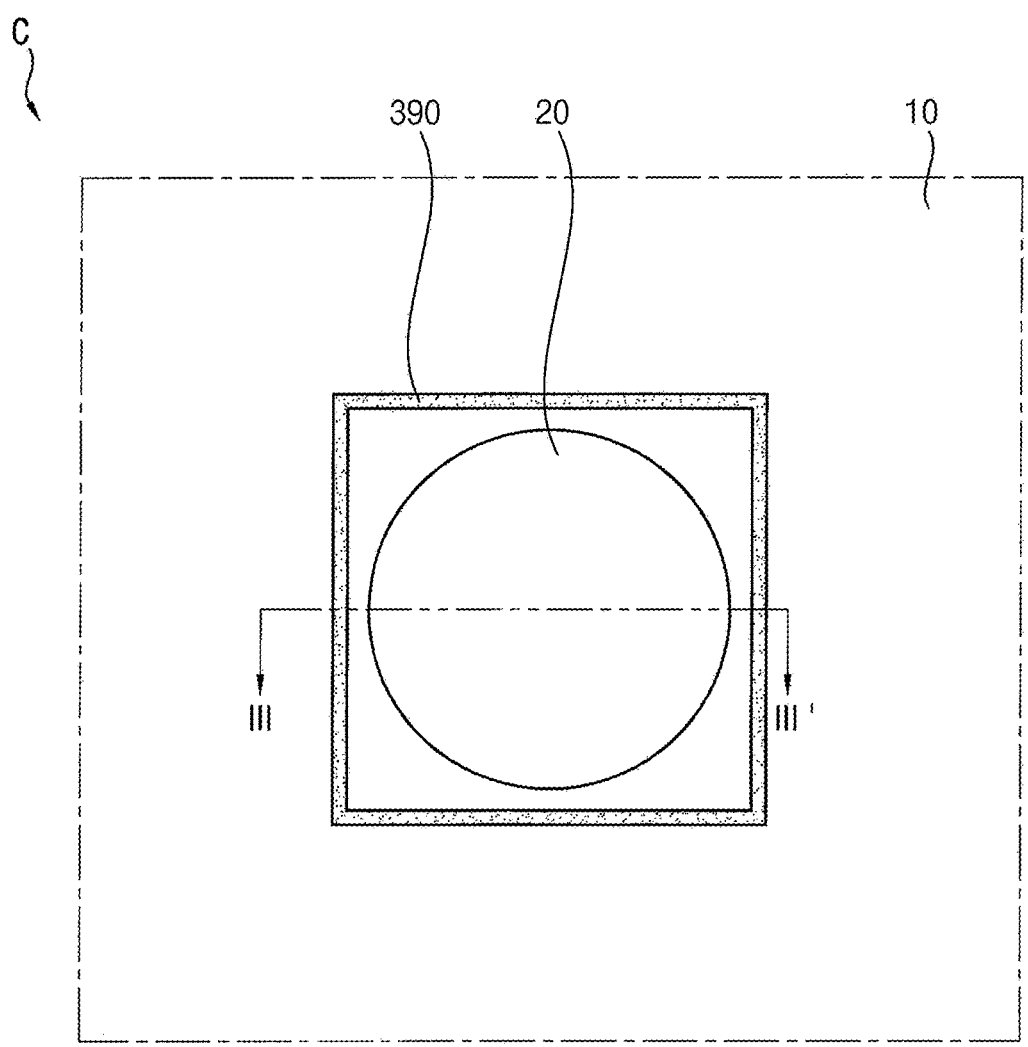
FIG. 10 is a partially enlarged plan view showing 'C' region of FIG. 9.
Figure 12:
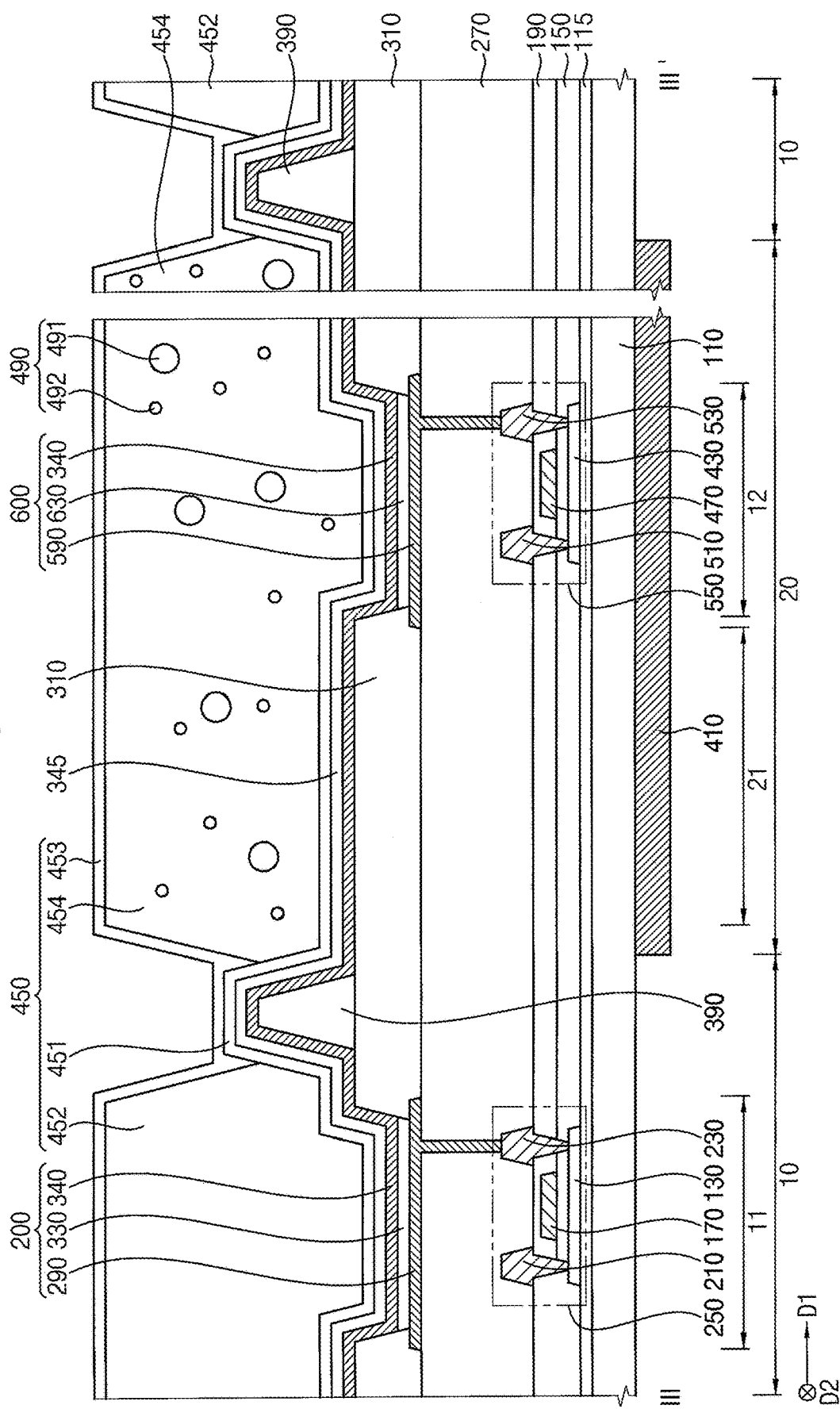
FIG. 12 is a cross-sectional view taken along line of FIG. 10.

FIG. 9 is a plan view showing an organic light emitting diode display device according to an alternative exemplary embodiment of the invention, FIG. 10 is a partially enlarged plan view showing 'C' region of FIG. 9, FIG. 11 is a plan view showing an exemplary embodiment of a partition structure included in the organic light emitting diode display device of FIG. 9, and FIG. 12 is a cross-sectional view taken along line of FIG. 10.

An organic light emitting diode display device 500 illustrated in FIGS. 9, 10, and 12 may have a configuration substantially the same or similar to the configuration of the organic light emitting diode display device 100 described above with reference to FIGS. 1 to 8 except for a partition structure 390. The same or like elements shown in FIGS. 9 to 12 have been labeled with the same reference characters as used above to describe the exemplary embodiments of the organic light emitting diode display device 100 shown in FIGS. 1 to 8, and any repetitive detailed description thereof will hereinafter be omitted or simplified.

Referring to FIGS. 9, 10, and 12, an exemplary embodiment of the organic light emitting diode display device 500 may include a substrate 110, a buffer layer 115, a first semiconductor element 250, a second semiconductor element 550, a gate insulating layer 150, an insulating interlayer 190, a planarization layer 270, a pixel defining layer 310, a first pixel structure 200, a second pixel structure 600, a capping layer 345, a thin film encapsulation structure 450, a functional module 410, a partition structure, and the like. In such an embodiment, as shown in FIG. 12, the substrate 110 may be divided into a display region 10 including a first pixel region 11, and a module region 20 including a second pixel region 12 and a transmissive region 21. The first pixel structure 200 is disposed in the display region 10, and the second pixel structure 600 is disposed in the module region 20, so that an image may be displayed in the display region 10 and the module region 20. In such an embodiment, the module region 20 includes the transmissive region 21, so that external light may be incident on the functional module 410 through the transmissive region 21.

In one exemplary embodiment, for example, the thin film encapsulation structure 450 may include a first inorganic thin film encapsulation layer 451, a first organic thin film encapsulation layer 452, a second inorganic thin film encapsulation layer 453, and a second organic thin film encapsulation layer 454. In an exemplary embodiment, the thin film encapsulation structure 450 located in the module region 20 may include a plurality of scatterers 490, and the scatterers 490 may include high refractive scatterers 491 and low refractive scatterers 492.

In an exemplary embodiment, the partition structure 390 may be disposed at an outer periphery of the module region 20 on the pixel defining layer 310 to surround the module region 20. In such an embodiment, the partition structure 390 may surround the second pixel structures 600 located in the module region 20 and the first pixel structures 200 located between the partition structure 390 and the module region 20. The first organic thin film encapsulation layer 452 and the second organic thin film encapsulation layer 454 may be spaced apart from each other on the partition structure 390. In an alternative exemplary embodiment, the partition structure 390 may be disposed in the module region 20. In such an embodiment, the partition structure 390 may surround the second pixel structures 600 located in the module region 20. In an exemplary embodiment, a portion of the partition structure 390 may be disposed in the module region 20, and the remaining portion of the partition structure 390 may be disposed at the outer periphery of the module region 20.

The partition structure 390 may include an organic material such as a photoresist, a polyacryl-based resin, a polyimide-based resin, a polyamide-based resin, a siloxane-based resin, an acryl-based resin, and an epoxy-based resin. The partition structure 390 may be formed simultaneously with the pixel defining layer 310 by using a same material as the pixel defining layer 310. In one exemplary embodiment, for example, a photoresist may be disposed over the planarization layer 270, the photoresist may be etched by using a half-tone mask, and the pixel defining layer 310 and the partition structure 390 may be simultaneously formed with each other.

In an exemplary embodiment, as shown in FIG. 10, the partition structure 390 may have a rectangular shape when viewed in a plan view. In an alternative exemplary embodiment, as shown in FIG. 11, the partition structure 390 may have a circular shape when viewed in a plan view. Alternatively, the partition structure 390 may have a triangular shape, a rhombic shape, a polygonal shape, a track shape, or an elliptical shape according to arrangement of pixels when viewed in a plan view.

In an exemplary embodiment, the first organic thin film encapsulation layer 452 may be disposed in the display region 10 on the first inorganic thin film encapsulation layer 451. In such an embodiment, the first organic thin film encapsulation layer 452 may be disposed on an outer side of the partition structure 390 on the first inorganic thin film encapsulation layer 451. The first organic thin film encapsulation layer 452 may be disposed on the first inorganic thin film encapsulation layer 451 with a relatively thick thickness, and may have a substantially flat top surface. In an exemplary embodiment, the first organic thin film encapsulation layer 452 may not include the scatterers 490. The first organic thin film encapsulation layer 452 may include an organic material having flexibility.

In an exemplary embodiment, the second organic thin film encapsulation layer 454 may be disposed in the module region 20 on the first inorganic thin film encapsulation layer 451 and in the display region 10 located on an inner side of the partition structure 390. In such an embodiment, the second organic thin film encapsulation layer 454 may be disposed on the inner side of the partition structure 390 on the first inorganic thin film encapsulation layer 451. The second organic thin film encapsulation layer 454 may be disposed on the first inorganic thin film encapsulation layer 451 with a relatively thick thickness, and may have a substantially flat top surface.

In an exemplary embodiment, the scatterers 490 may be located inside the second organic thin film encapsulation layer 454 located in the module region 20. In such an embodiment, a refractive index of the first organic thin film encapsulation layer 452 located in the display region 10 may be different from a refractive index of the second organic thin film encapsulation layer 454 located in the module region 20.

The second inorganic thin film encapsulation layer 453 may be disposed on the partition structure 390, the first organic thin film encapsulation layer 452, and the second organic thin film encapsulation layer 454. The second inorganic thin film encapsulation layer 453 may be disposed along a profile of the partition structure 390, the first organic thin film encapsulation layer 452, and the second organic thin film encapsulation layer 454 with a uniform thickness to cover the partition structure 390, the first organic thin film encapsulation layer 452, and the second organic thin film encapsulation layer 454. The second inorganic thin film encapsulation layer 453 may include an inorganic material having the flexibility.

Accordingly, the thin film encapsulation structure 450 including the first inorganic thin film encapsulation layer 451, the first organic thin film encapsulation layer 452, the second inorganic thin film encapsulation layer 453, and the second organic thin film encapsulation layer 454 may be provided.

In an exemplary embodiment of the invention, the organic light emitting diode display device 500 includes the partition structure 390, the first organic thin film encapsulation layer 452, and the second organic thin film encapsulation layer 454, so that the first organic thin film encapsulation layer 452 may be separated from the second organic thin film encapsulation layer 454 such that the scatterers 490 may be located only inside the second organic thin film encapsulation layer 454. Accordingly, in such an embodiment of the organic light emitting diode display device 500, the scatterers 490 may be effectively prevented from leaking from the module region 20 to the display region 10.

Figure 13:
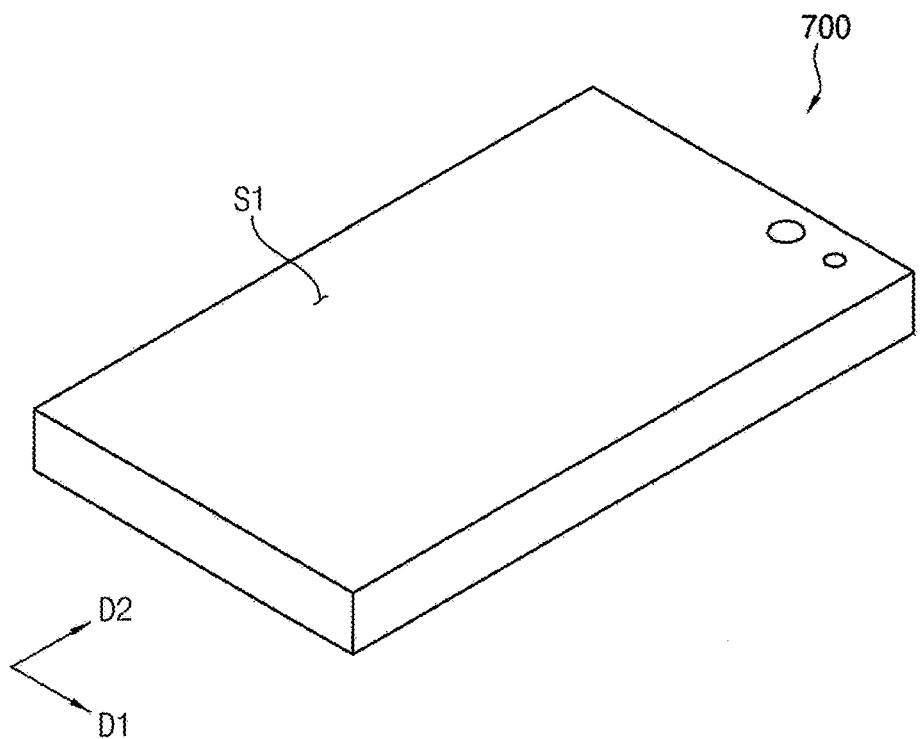
FIG. 13 is a perspective view showing an organic light emitting diode display device according to another alternative exemplary embodiment of the invention.
Figure 14:
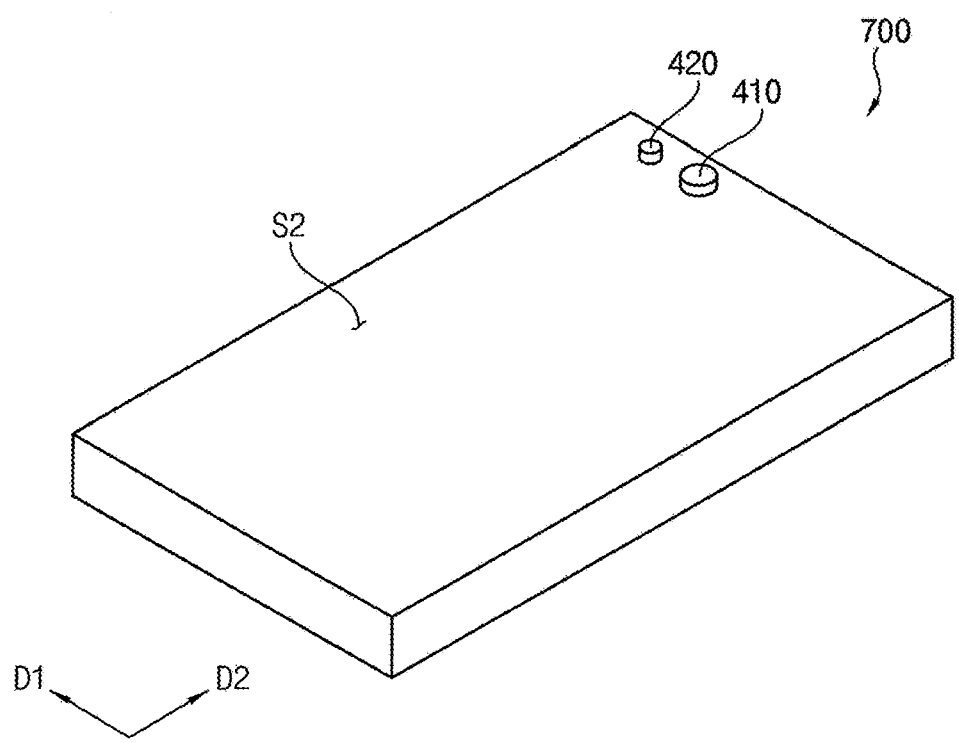
FIG. 14 is a perspective view showing a first functional module and a second functional module disposed on a rear surface of the organic light emitting diode display device of FIG. 13.
Figure 15:
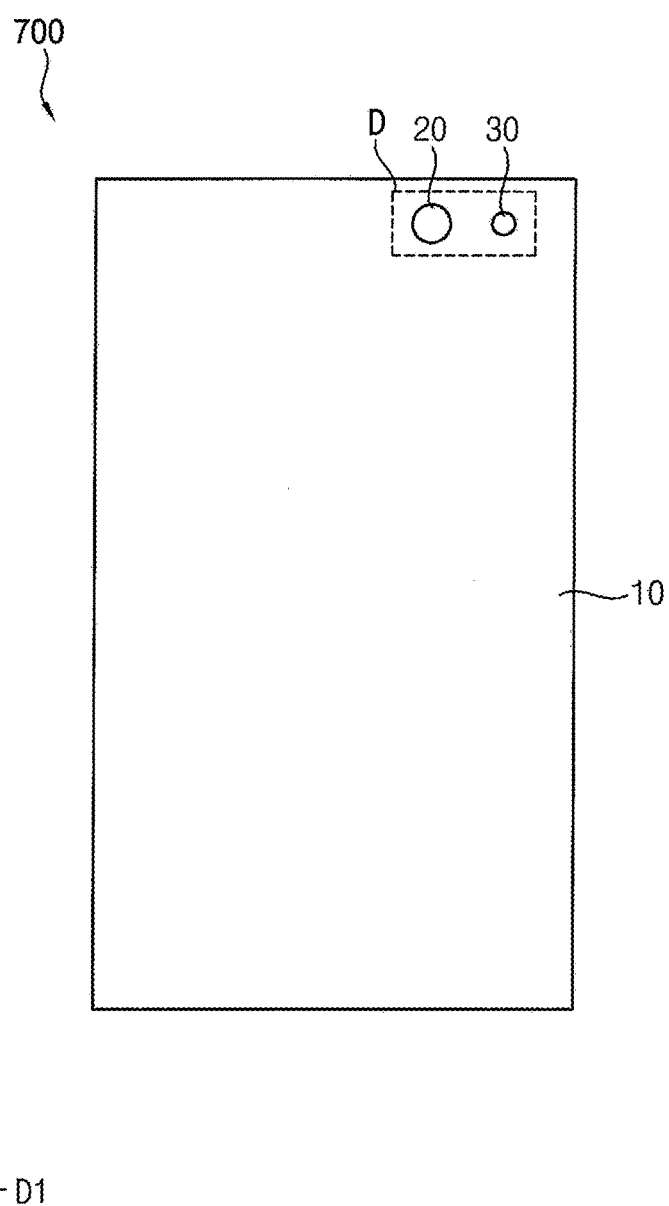
FIG. 15 is a plan view for describing a display region, a first module region, and a second module region of the organic light emitting diode display device of FIG. 13.

FIG. 13 is a perspective view showing an organic light emitting diode display device according to another alternative exemplary embodiment of the invention, FIG. 14 is a perspective view showing a first functional module and a second functional module disposed on a rear surface of the organic light emitting diode display device of FIG. 13, and FIG. 15 is a plan view for describing a display region, a first module region, and a second module region of the organic light emitting diode display device of FIG. 13.

An organic light emitting diode display device 700 illustrated in FIGS. 13, 14, and 15 may have a configuration substantially identical or similar to the configuration of the organic light emitting diode display device 500 described with reference to FIGS. 9, 10, and 12 except for a second module region 30 and a second functional module 420. The same or like elements shown in FIGS. 13 to 15 have been labeled with the same reference characters as used above to describe the exemplary embodiments of the organic light emitting diode display device 100 shown in FIGS. 9, 10 and 12, and any repetitive detailed description thereof will hereinafter be omitted or simplified.

Referring to FIGS. 13, 14, and 15, an exemplary embodiment of the organic light emitting diode display device 700 may include a substrate 110 (see FIG. 18), a thin film encapsulation structure 450 (see FIG. 18), a first functional module 410, a second functional module 420, and the like. The first functional module 410 and the second functional module 420 may be located on one side portion, e.g., an upper side portion, of a bottom surface of the substrate 110.

In an exemplary embodiment, the organic light emitting diode display device 700 may include a display region 10, a first module region 20, and a second module region 30. In such an embodiment, the first module region 20 and the second module region 30 may be spaced apart from each other, and the display region 10 may surround at least a portion of each of the first module region 20 and the second module region 30. The first functional module 410 may overlap the first module region 20, and the second functional module 420 may overlap the second module region 30. In an exemplary embodiment, the display region 10 may completely surround the first module region 20 and the second module region 30, and an area of the display region 10 may be greater than an area of the first module region 20 and an area of the second module region 30.

Figure 17:
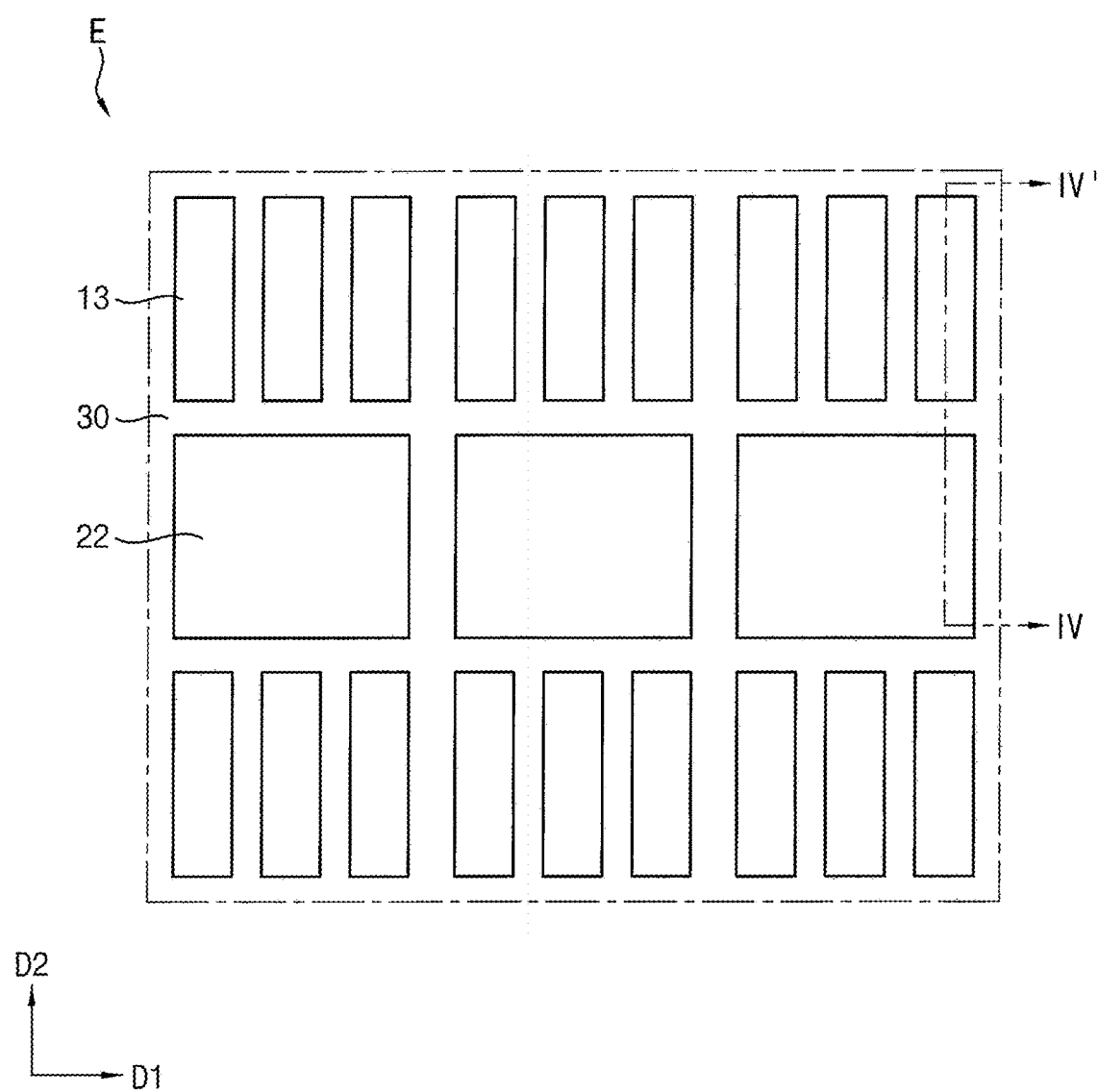
FIG. 17 is a partially enlarged plan view showing 'E' region of a second module region shown in FIG. 16.

The display region 10 may include a plurality of first pixel regions (e.g., corresponding to the first pixel region 11 of FIG. 4), the first module region 20 may include a plurality of second pixel regions and a plurality of first transmissive regions (e.g., corresponding to the second pixel region 12 and the transmissive region 21 of FIG. 5), and the second module region 30 may include a plurality of third pixel regions and a plurality of second transmissive regions (e.g., corresponding to a third pixel region 13 and a second transmissive region 22 of FIG. 17).

In an exemplary embodiment, as described above, the first functional module 410 may overlap the first module region 20 on the bottom surface of the substrate 110. In such an embodiment, a size of the first module region 20 may be substantially the same as a size of the first functional module 410. In such an embodiment, a shape of the first module region 20 may correspond to a shape of the first functional module 410. In such an embodiment, the second functional module 420 may overlap the second module region 30 on the bottom surface of the substrate 110. In such an embodiment, a size of the second module region 30 may be substantially the same as a size of the second functional module 420. In such an embodiment, a shape of the second module region 30 may correspond to a shape of the second functional module 420. Each of the first functional module 410 and the second functional module 420 may include at least one selected from a camera module, a face recognition sensor module, a pupil recognition sensor module, an acceleration sensor module, a geomagnetic sensor module, a proximity sensor module, an infrared sensor module, an illuminance sensor module, and the like.

Here, for convenience of illustration and description, exemplary embodiments where each of the first module region 20, the second module region 30, the first functional module 410, and the second functional module 420 according to the invention has a circular shape when viewed in a plan view are described, but the shape of each of the first module region 20, the second module region 30, the first functional module 410, and the second functional module 420 is not limited thereto. In one alternative exemplary embodiment, for example, the module region 20 may have a triangular shape, a rectangular shape, a rhombic shape, a polygonal shape, a track shape, or an elliptical shape when viewed in a plan view.

Figure 16:
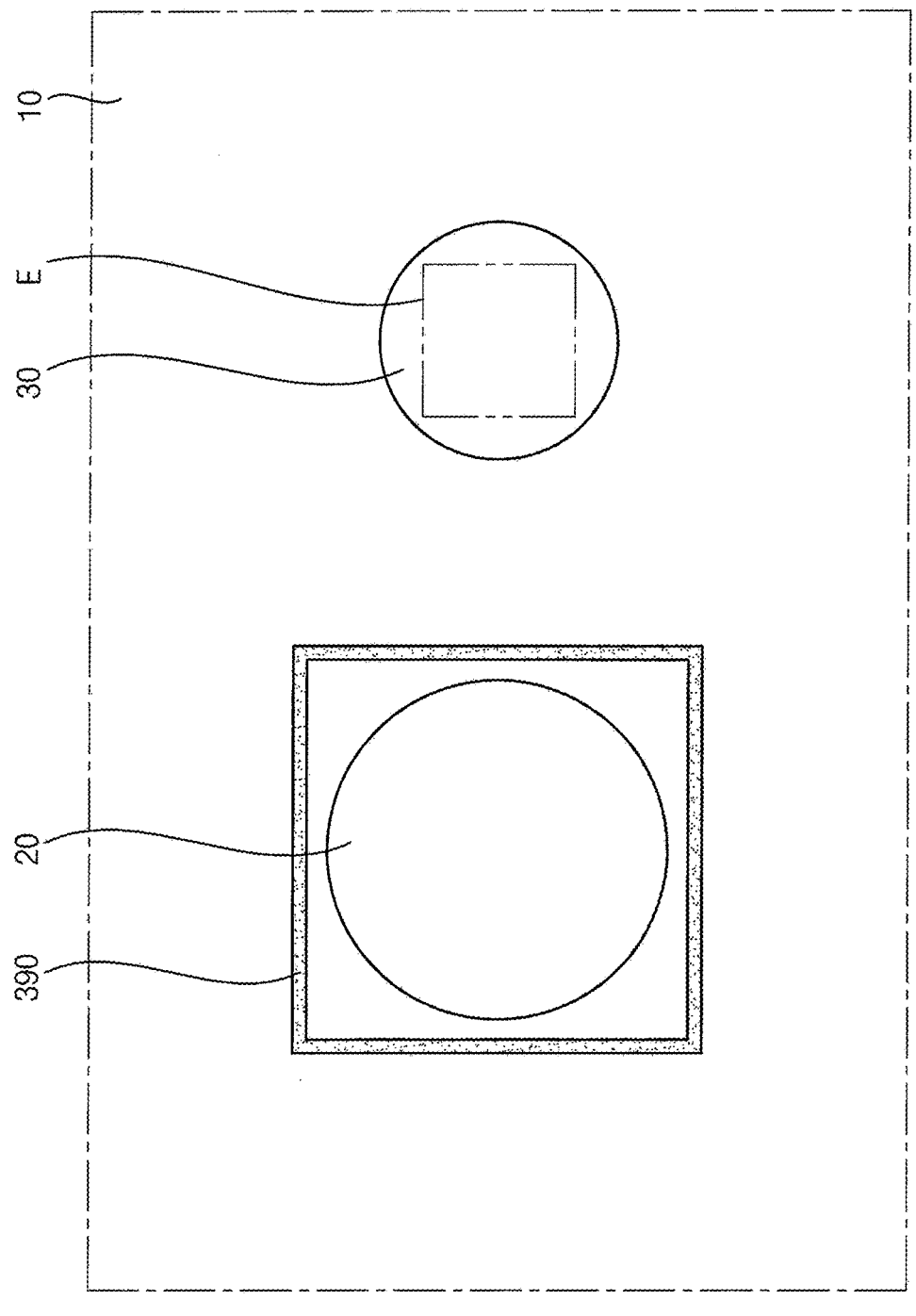
FIG. 16 is a partially enlarged plan view showing 'D' region of FIG. 15.

FIG. 16 is a partially enlarged plan view showing 'D' region of FIG. 15, and FIG. 17 is a partially enlarged plan view showing 'E' region of a second module region shown in FIG. 16.

Referring to FIGS. 4, 5, 16, and 17, in an exemplary embodiment, the display region 10 of the organic light emitting diode display device 700 may include a plurality of first pixel regions 11. In such an embodiment, the first pixel regions 11 may be arranged over the display region 10.

In an exemplary embodiment, as shown in FIG. 5, the first module region 20 of the organic light emitting diode display device 700 may include a plurality of second pixel regions 12 and a plurality of first transmissive regions 21. In such an embodiment, the second pixel regions 12 and the first transmissive regions 21 may be arranged over the first module region 20.

In an exemplary embodiment, as shown in FIG. 17, the second module region 30 of the organic light emitting diode display device 700 may include a plurality of third pixel regions 13 and a plurality of second transmissive regions 22. In one exemplary embodiment, for example, the third pixel regions 13 may be arranged in a first direction D1 in the second module region 30, and the second transmissive regions 22 may be arranged in the first direction D1 in a row different from a row in which the third pixel regions 13 are arranged. In such an embodiment, the third pixel regions 13 and the second transmissive regions 22 may be arranged over the second module region 30. In an exemplary embodiment, the second module region 30 may include a relatively small number of pixel regions per unit area due to the second transmissive regions 22 compared to the first pixel regions 11 disposed in the display region 10 as shown in FIG. 4. In such an embodiment, a resolution of the second module region 30 may be lower than a resolution of the display region 10. In such an embodiment, the second transmissive region 22 may be substantially transparent.

Herein, for convenience of illustration and description, exemplary embodiments, where each of the third pixel region 13 and the second transmissive region 22 has a rectangular shape when viewed in a plan view are shown and described, but the shapes are not limited thereto. Alternatively, each of the third pixel region 13 and the second transmissive region 22 may have a triangular shape, a rhombic shape, a polygonal shape, a circular shape, a track shape, or an elliptical shape, for example, when viewed in a plan view.

Herein, for convenience of illustration and description, exemplary embodiments, where the third pixel regions 13 are in the RGB stripe scheme are shown and described, but the configuration of the invention is not limited thereto. Alternatively, the third pixel regions 13 may be arranged by using the S-stripe scheme, the WRGB scheme, the PenTile scheme, or the like, for example.

Figure 18:
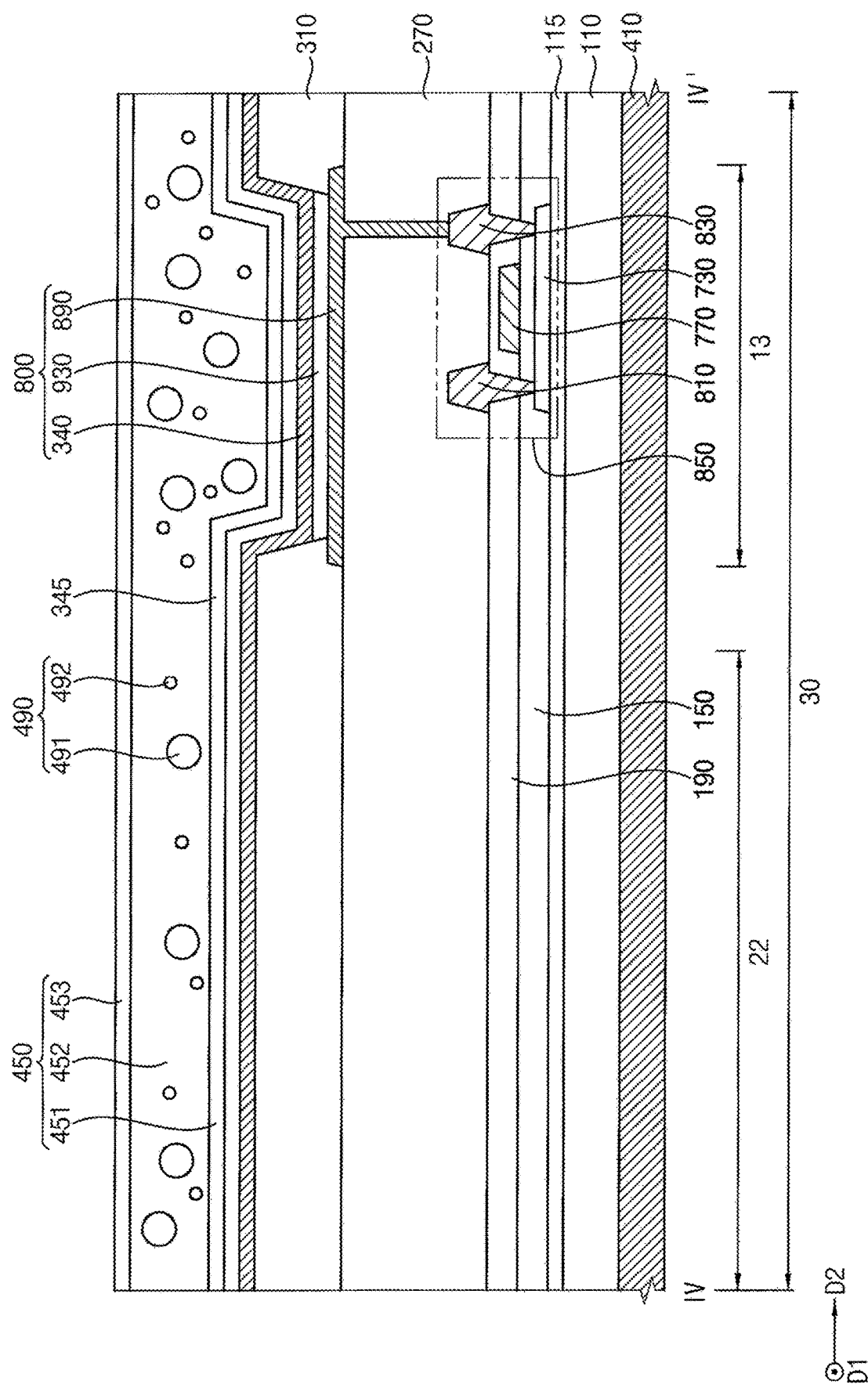
FIG. 18 is a cross-sectional view taken along line IV-IV' of FIG. 17.

FIG. 18 is a cross-sectional view taken along line IV-IV' of FIG. 17.

Referring to FIGS. 12 and 18, in an exemplary embodiment, the organic light emitting diode display device 700 may include a substrate 110, a buffer layer 115, a first semiconductor element 250, a second semiconductor element 550, a third semiconductor element 850, a gate insulating layer 150, an insulating interlayer 190, a planarization layer 270, a pixel defining layer 310, a partition structure 390, a first pixel structure 200, a second pixel structure 600, a third pixel structure 800, a capping layer 345, a thin film encapsulation structure 450, a first functional module 410, a second functional module 420, and the like. In such an embodiment, the organic light emitting diode display device 700 includes a display region 10 including a first pixel region 11, a module region 20 including a second pixel region 12 and a first transmissive region 21, and a second module region 30 including a third pixel region 13 and a second transmissive region 22, so that the substrate 110 may also be divided into the display region 10 including the first pixel region 11, the module region 20 including the second pixel region 12 and the first transmissive region 21, and the second module region 30 including the third pixel region 13 and the second transmissive region 22. The first pixel structure 200 is disposed in the display region 10, the second pixel structure 600 is disposed in the first module region 20, and the third pixel structure 800 is disposed in the second module region 30, so that an image may be displayed in the display region 10, the first module region 20, and the second module region 30. In such an embodiment, the first module region 20 includes the first transmissive region 21 so that external light may be incident on the first functional module 410 through the first transmissive region 21, and the second module region 30 includes the second transmissive region 22, so that the external light may be incident on the second functional module 420 through the second transmissive region 22.

In an exemplary embodiment, as shown in FIG. 18, the third semiconductor element 850 may include a third active layer 730, a third gate electrode 770, a third source electrode 810, and a third drain electrode 830. In such an embodiment, the third pixel structure 800 may include a third lower electrode 890, a third light emitting layer 930, and an upper electrode 340. In such an embodiment, the thin film encapsulation structure 450 may include a first inorganic thin film encapsulation layer 451, a first organic thin film encapsulation layer 452, a second inorganic thin film encapsulation layer 453, and a second organic thin film encapsulation layer 454. In an exemplary embodiment, the thin film encapsulation structure 450 located in the first module region 20 and the second module region 30 may include a plurality of scatterers 490, and the scatterers 490 may include high refractive scatterers 491 and low refractive scatterers 492.

In an exemplary embodiment, the first organic thin film encapsulation layer 452 may be disposed in the display region 10 and the second module region 30 on the first inorganic thin film encapsulation layer 451. In such an embodiment, the first organic thin film encapsulation layer 452 may be disposed on an outer side of the partition structure 390 on the first inorganic thin film encapsulation layer 451. The first organic thin film encapsulation layer 452 may be disposed on the first inorganic thin film encapsulation layer 451 with a relatively thick thickness, and may have a substantially flat top surface. In an exemplary embodiment, as shown in FIG. 7, the first organic thin film encapsulation layer 452 located in the display region 10 may not include the scatterers 490, and as shown in FIG. 18, the scatterers 490 may be located inside the first organic thin film encapsulation layer 452 located in the second module region 30. In such an embodiment, a refractive index of the first organic thin film encapsulation layer 452 located in the display region 10 may be different from a refractive index of the first organic thin film encapsulation layer 452 located in the second module region 30. In such an embodiment, the refractive index of the first organic thin film encapsulation layer 452 located in the display region 10 may be different from a refractive index of the second organic thin film encapsulation layer 454. The first organic thin film encapsulation layer 452 may include an organic material having flexibility.

The second inorganic thin film encapsulation layer 453 may be disposed on the partition structure 390, the first organic thin film encapsulation layer 452, and the second organic thin film encapsulation layer 454. The second inorganic thin film encapsulation layer 453 may be disposed along a profile of the partition structure 390, the first organic thin film encapsulation layer 452, and the second organic thin film encapsulation layer 454 with a uniform thickness to cover the partition structure 390, the first organic thin film encapsulation layer 452, and the second organic thin film encapsulation layer 454. In one exemplary embodiment, for example, the second inorganic thin film encapsulation layer 453 may be disposed at an outermost portion of the organic light emitting diode display device 700, and the first inorganic thin film encapsulation layer 451 and the second inorganic thin film encapsulation layer 453 may make direct contact with each other at the outermost portion. In such an embodiment, the second inorganic thin film encapsulation layer 453 may prevent the first, second, and third pixel structures 200, 600, and 800 from being deteriorated due to the penetration of moisture, oxygen, and the like together with the buffer layer 115 and the first inorganic thin film encapsulation layer 451. In such an embodiment, the second inorganic thin film encapsulation layer 453 may function to protect the first, second, and third pixel structures 200, 600, and 800 from an external impact together with the first inorganic thin film encapsulation layer 451, the first organic thin film encapsulation layer 452, and the second organic thin film encapsulation layer 454. The second inorganic thin film encapsulation layer 453 may include inorganic materials having the flexibility.

Accordingly, the thin film encapsulation structure 450 including the first inorganic thin film encapsulation layer 451, the first organic thin film encapsulation layer 452, the second inorganic thin film encapsulation layer 453, and the second organic thin film encapsulation layer 454 may be provided.

The first functional module 410 may be disposed in the first module region 20 on the bottom surface of the substrate 110. In such an embodiment, as described above, a portion of the external light incident on the top surface of the thin film encapsulation structure 450 may be incident on the first functional module 410 through the first transmissive regions 21 located in the first module region 20, and the first functional module 410 may operate through the incident external light.

The second functional module 420 may be disposed in the second module region 30 on the bottom surface of the substrate 110. In such an embodiment, as described above, a portion of the external light incident on the top surface of the thin film encapsulation structure 450 may be incident on the second functional module 420 through the second transmissive regions 22 located in the second module region 30, and the second functional module 420 may operate through the incident external light.

Each of the first functional module 410 and the second functional module 420 may include at least one selected from a camera module, a face recognition sensor module, a pupil recognition sensor module, an acceleration sensor module, a geomagnetic sensor module, a proximity sensor module, an infrared sensor module, an illuminance sensor module, and the like.

In an exemplary embodiment, where the organic light emitting diode display device 700 has the same refractive index in the first module region 20 and the second module region 30, the first functional module 410 and the second functional module 420 may include a same type of module as each other. In one exemplary embodiment, for example, each of the first functional module 410 and the second functional module 420 may include a camera module. In an alternative exemplary embodiment, where the organic light emitting diode display device 700 has different refractive indexes in the first module region 20 and the second module region 30, the first functional module 410 and the second functional module 420 may include different types of modules. In one exemplary embodiment, for example, the first functional module 410 may include a camera module, and the second functional module 420 may include at least one selected from a face recognition sensor module, a pupil recognition sensor module, a proximity sensor module, an infrared sensor module, and an illuminance sensor module.

In an alternative exemplary embodiment, the organic light emitting diode display device 700 may further include a third module region spaced apart from the first module region 20 and the second module region 30, and a third functional module disposed in the third module region.

Figure 19:
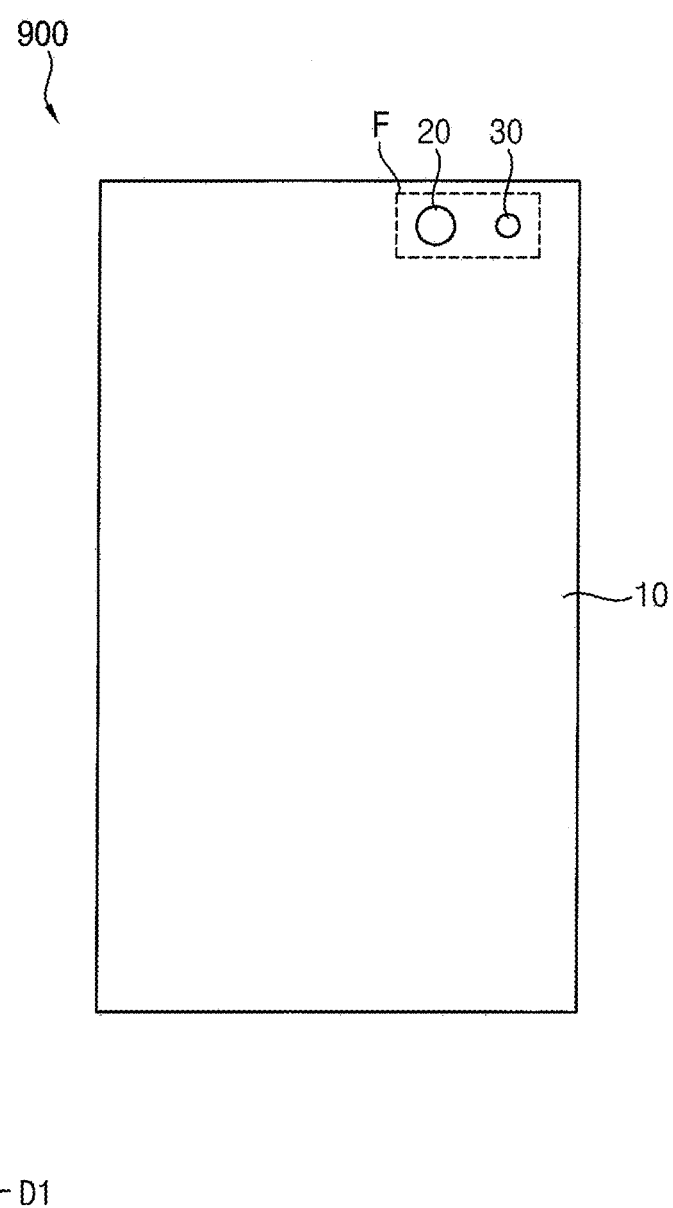
FIG. 19 is a plan view showing an organic light emitting diode display device according to another alternative exemplary embodiment of the invention.
Figure 20:
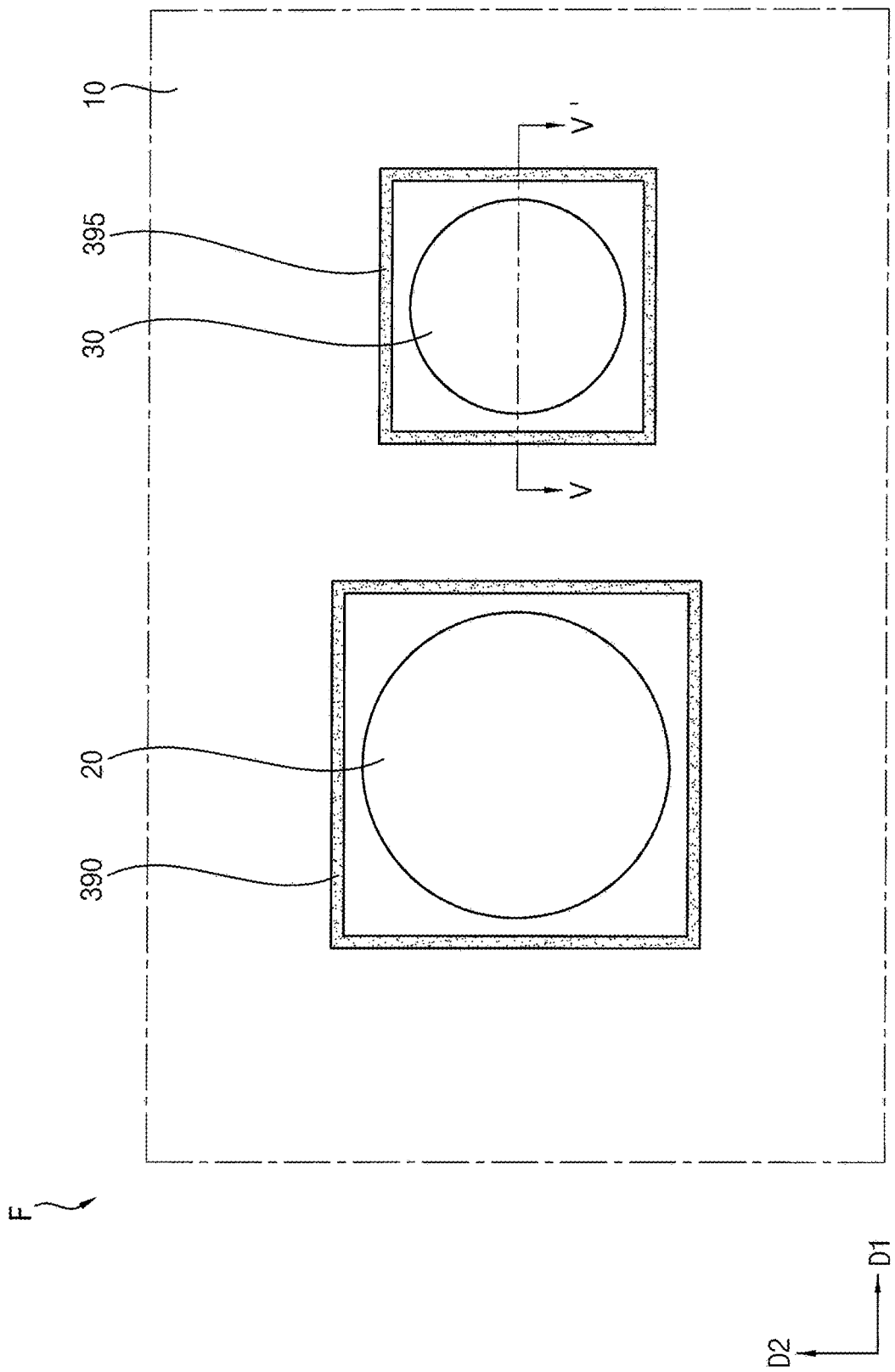
FIG. 20 is a partially enlarged plan view showing 'F' region of FIG. 19.
Figure 21:
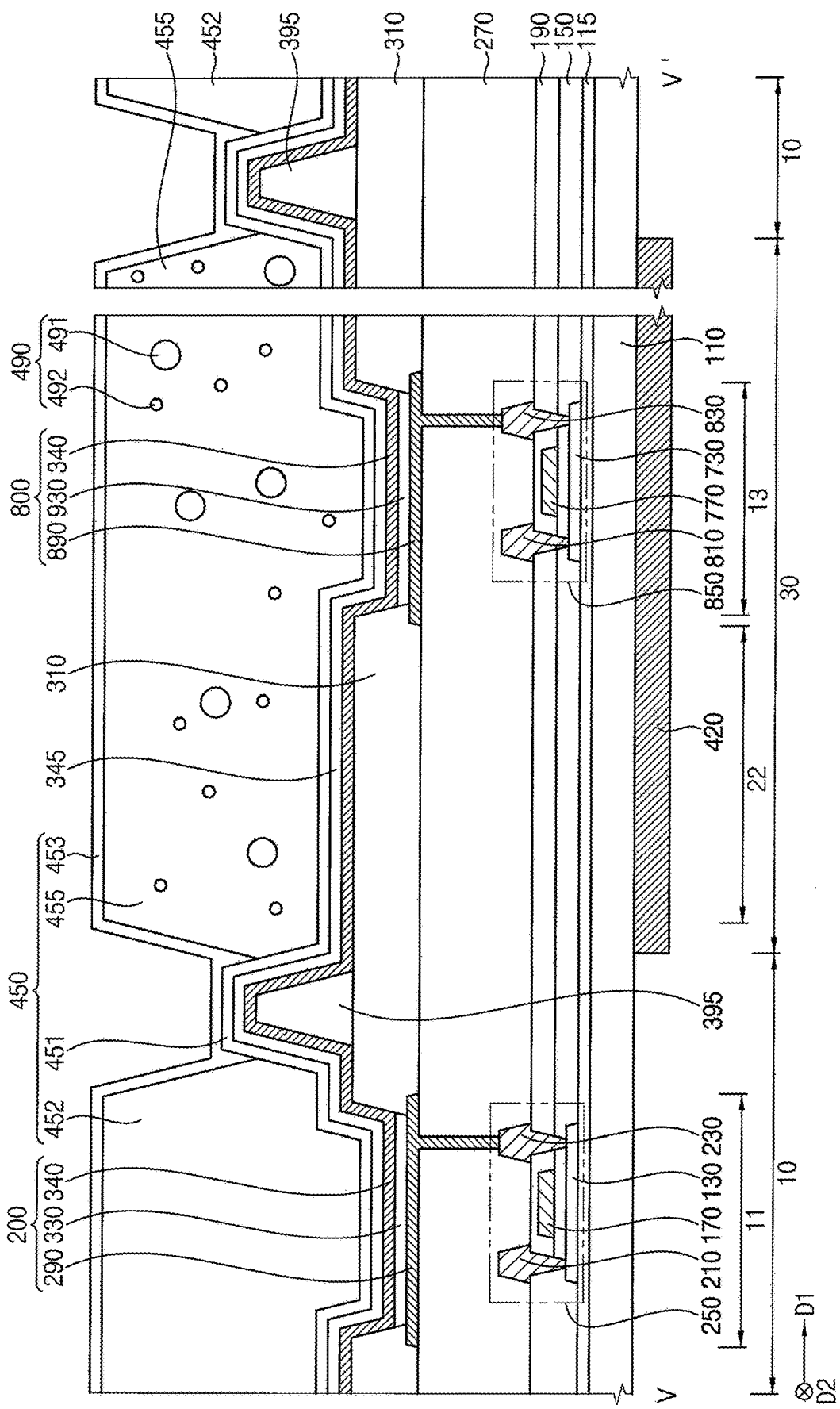
FIG. 21 is a cross-sectional view taken along line V-V' of FIG. 19.

FIG. 19 is a plan view showing an organic light emitting diode display device according to another alternative exemplary embodiment of the invention, FIG. 20 is a partially enlarged plan view showing 'F' region of FIG. 19, and FIG. 21 is a cross-sectional view taken along line V-V' of FIG. 19.

An organic light emitting diode display device 900 illustrated in FIGS. 19, 20, and 21 may have a configuration substantially identical or similar to the configuration of the organic light emitting diode display device 400 described with reference to FIGS. 13 to 18 except for a second partition structure 395. The same or like elements shown in FIGS. 19 to 21 have been labeled with the same reference characters as used above to describe the exemplary embodiments of the organic light emitting diode display device 100 shown in FIGS. 13 to 18, and any repetitive detailed description thereof will hereinafter be omitted or simplified.

Referring to FIGS. 12, 19, 20, and 21, in an exemplary embodiment, the organic light emitting diode display device 900 may include a substrate 110, a buffer layer 115, a first semiconductor element 250, a second semiconductor element 550, a third semiconductor element 850, a gate insulating layer 150, an insulating interlayer 190, a planarization layer 270, a pixel defining layer 310, a first partition structure 390, a second partition structure 395, a first pixel structure 200, a second pixel structure 600, a third pixel structure 800, a capping layer 345, a thin film encapsulation structure 450, a first functional module 410, a second functional module 420, and the like. In such an embodiment, the organic light emitting diode display device 900 includes a display region 10 including a first pixel region 11, a module region 20 including a second pixel region 12 and a first transmissive region 21, and a second module region 30 including a third pixel region 13 and a second transmissive region 22, so that the substrate 110 may also be divided into the display region 10 including the first pixel region 11, the module region 20 including the second pixel region 12 and the first transmissive region 21, and the second module region 30 including the third pixel region 13 and the second transmissive region 22.

In an exemplary embodiment, as shown in FIG. 21, the thin film encapsulation structure 450 may include a first inorganic thin film encapsulation layer 451, a first organic thin film encapsulation layer 452, a second inorganic thin film encapsulation layer 453, a second organic thin film encapsulation layer 454, and a third organic thin film encapsulation layer 455. In an exemplary embodiment, the thin film encapsulation structure 450 located in the first module region 20 and the second module region 30 may include a plurality of scatterers 490, and the scatterers 490 may include high refractive scatterers 491 and low refractive scatterers 492.

In an exemplary embodiment, the second partition structure 395 may be disposed at an outer periphery of the second module region 30 on the pixel defining layer 310 to surround the second module region 30. In such an embodiment, the second partition structure 395 may surround the third pixel structures 800 located in the second module region 30 and the first pixel structures 200 located between the second partition structure 395 and the second module region 30. The first organic thin film encapsulation layer 452 and the third organic thin film encapsulation layer 455 may be spaced apart from each other on the second partition structure 395. In an alternative exemplary embodiment, the second partition structure 395 may be disposed in the second module region 30. In such an embodiment, the second partition structure 395 may surround the third pixel structures 800 located in the second module region 30. In such an embodiment, a portion of the second partition structure 395 may be disposed in the second module region 30, and the remaining portion of the second partition structure 395 may be disposed at the outer periphery of the second module region 30.

The second partition structure 395 may include an organic material. The second partition structure 395 may be formed simultaneously with the pixel defining layer 310 and the first partition structure 390 by using a same material as the pixel defining layer 310 and the first partition structure 390. In one exemplary embodiment, for example, a photoresist may be disposed over the planarization layer 270, the photoresist may be etched by using a half-tone mask, and the pixel defining layer 310, the first partition structure 390, and the second partition structure 395 may be simultaneously formed.

In an exemplary embodiment, as shown in FIG. 20, the second partition structure 395 may have a rectangular shape when viewed in a plan view. In an alternative exemplary embodiments, the second partition structure 395 may have a circular shape when viewed in a plan view. Alternatively, the second partition structure 395 may have a triangular shape, a rhombic shape, a polygonal shape, a track shape, or an elliptical shape, for example, according to arrangement of pixels when viewed in a plan view.

In an exemplary embodiment, the first organic thin film encapsulation layer 452 may be disposed in the display region 10 on the first inorganic thin film encapsulation layer 451. In such an embodiment, the first organic thin film encapsulation layer 452 may be disposed on an outer side of the first partition structure 390 and an outer side of the second partition structure 395 on the first inorganic thin film encapsulation layer 451. In an exemplary embodiment, the first organic thin film encapsulation layer 452 may not include the scatterers 490.

In an exemplary embodiment, the second organic thin film encapsulation layer 454 may be disposed in the first module region 20 on the first inorganic thin film encapsulation layer 451 and in the display region 10 located on an inner side of the first partition structure 390. In such an embodiment, the second organic thin film encapsulation layer 454 may be disposed on the inner side of the first partition structure 390 on the first inorganic thin film encapsulation layer 451. In an exemplary embodiment, the scatterers 490 may be located inside the second organic thin film encapsulation layer 454 located in the first module region 20.

In an exemplary embodiment, the third organic thin film encapsulation layer 455 may be disposed in the second module region 30 on the first inorganic thin film encapsulation layer 451 and in the display region 10 located on an inner side of the second partition structure 395. In such an embodiment, the third organic thin film encapsulation layer 455 may be disposed on the inner side of the second partition structure 395 on the first inorganic thin film encapsulation layer 451. In an exemplary embodiment, the scatterers 490 may be located inside the third organic thin film encapsulation layer 455 located in the second module region 30.

The second inorganic thin film encapsulation layer 453 may be disposed on the first partition structure 390, the second partition structure 395, the first organic thin film encapsulation layer 452, the second organic thin film encapsulation layer 454, and the third organic thin film encapsulation layer 455. The second inorganic thin film encapsulation layer 453 may be disposed along a profile of the first partition structure 390, the second partition structure 395, the first organic thin film encapsulation layer 452, the second organic thin film encapsulation layer 454, and the third organic thin film encapsulation layer 455 with a uniform thickness to cover the first partition structure 390, the second partition structure 395, the first organic thin film encapsulation layer 452, the second organic thin film encapsulation layer 454, and the third organic thin film encapsulation layer 455. The second inorganic thin film encapsulation layer 453 may include an inorganic material having the flexibility.

In an exemplary embodiment, a refractive index of the first organic thin film encapsulation layer 452 may be different from a refractive index of the second organic thin film encapsulation layer 454, and the refractive index of the first organic thin film encapsulation layer 452 may be different from a refractive index of the third organic thin film encapsulation layer 455.

Accordingly, thin film encapsulation structure 450 including the first inorganic thin film encapsulation layer 451, the first organic thin film encapsulation layer 452, the second inorganic thin film encapsulation layer 453, the second organic thin film encapsulation layer 454, and the third organic thin film encapsulation layer 455 may be provided.

In exemplary embodiments of the invention, the organic light emitting diode display device 900 includes the first partition structure 390, the second partition structure 395, the first organic thin film encapsulation layer 452, the second organic thin film encapsulation layer 454, and the third organic thin film encapsulation layer 455, so that the first organic thin film encapsulation layer 452 may be separated from the second organic thin film encapsulation layer 454 and the third organic thin film encapsulation layer 455. Accordingly, in such embodiments, the scatterers 490 may be located only inside each of the second organic thin film encapsulation layer 454 and the third organic thin film encapsulation layer 455. In exemplary embodiments of the organic light emitting diode display device 900, the scatterers 490 may be effectively prevented from leaking from the first module region 20 and the second module region 30 to the display region 10.

Exemplary embodiments of the invention may be applied to various electronic devices including an organic light emitting diode display device, e.g., vehicle-display device, a ship-display device, an aircraft-display device, portable communication devices, display devices for display or for information transfer, a medical-display device, etc.

The invention should not be construed as being limited to the exemplary embodiments set forth herein. Rather, these exemplary embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. An organic light emitting diode display device comprising:
    a substrate including a display region and a module region, wherein the display region includes a first pixel region, and the module region includes a second pixel region and a transmissive region;
    a first pixel structure disposed in the first pixel region on the substrate;
    a second pixel structure disposed in the second pixel region on the substrate;
    a thin film encapsulation structure disposed on the first and second pixel structures, wherein a light transmittance of a portion of the thin film encapsulation structure in the display region is different from a light transmittance of a portion of the thin film encapsulation structure in the module region, and the portion of the thin film encapsulation structure in the module region includes a plurality of scatterers; and
    a functional module disposed in the module region on a bottom surface of the substrate.

2. The organic light emitting diode display device of claim 1, wherein the thin film encapsulation structure includes:
    a first inorganic thin film encapsulation layer disposed on the first and second pixel structures;
    a first organic thin film encapsulation layer disposed on the first inorganic thin film encapsulation layer; and
    a second inorganic thin film encapsulation layer disposed on the first organic thin film encapsulation layer.

3. The organic light emitting diode display device of claim 2, wherein the scatterers are disposed inside a portion of the first organic thin film encapsulation layer located in the module region.

4. The organic light emitting diode display device of claim 2, wherein a refractive index of the first organic thin film encapsulation layer located in the display region is different from a refractive index of the first organic thin film encapsulation layer located in the module region.

5. The organic light emitting diode display device of claim 1, wherein the scatterers include low refractive scatterers and high refractive scatterers.

6. The organic light emitting diode display device of claim 1, wherein the display region surrounds at least a portion of the module region.

7. The organic light emitting diode display device of claim 1, further comprising:
    a partition structure disposed at an outer periphery of the module region on the substrate to surround the second pixel structure.

8. The organic light emitting diode display device of claim 7, wherein the thin film encapsulation structure includes:
    a first inorganic thin film encapsulation layer disposed on the first and second pixel structures and the partition structure;
    a first organic thin film encapsulation layer disposed in the display region on the first inorganic thin film encapsulation layer;
    a second organic thin film encapsulation layer disposed in the module region on the first inorganic thin film encapsulation layer; and
    a second inorganic thin film encapsulation layer disposed on the first and second organic thin film encapsulation layers.

9. The organic light emitting diode display device of claim 8, wherein the scatterers are disposed inside the second organic thin film encapsulation layer.

10. The organic light emitting diode display device of claim 8, wherein
the first organic thin film encapsulation layer is disposed on an outer side of the partition structure,
the second organic thin film encapsulation layer is disposed on an inner side of the partition structure, and
a refractive index of the first organic thin film encapsulation layer is different from a refractive index of the second organic thin film encapsulation layer.

11. An organic light emitting diode display device comprising:
a substrate including: a display region including a first pixel region; a first module region including a second pixel region and a first transmissive region; and a second module region spaced apart from the first module region and including a third pixel region and a second transmissive region;
a first pixel structure disposed in the first pixel region on the substrate;
a second pixel structure disposed in the second pixel region on the substrate;
a third pixel structure disposed in the third pixel region on the substrate;
a first partition structure surrounding the second pixel structure;
a thin film encapsulation structure disposed on the first, second, and third pixel structures and the first partition structure, wherein a light transmittance of a portion of the thin film encapsulation structure in the display region is different from a light transmittance of a portion of the thin film encapsulation structure in the first module region, the light transmittance of the portion of the thin film encapsulation structure in the display region is different from a light transmittance of a portion of the thin film encapsulation structure in the second module region, and the portion of the thin film encapsulation structure in the first module region and the portion of the thin film encapsulation structure in the second module region includes a plurality of scatterers in the first and second module regions;
a first functional module disposed in the first module region on a bottom surface of the substrate; and
a second functional module disposed in the second module region on the bottom surface of the substrate.

12. The organic light emitting diode display device of claim 11, wherein the thin film encapsulation structure includes:
a first inorganic thin film encapsulation layer disposed on the first, second, and third pixel structures and the first partition structure;
a first organic thin film encapsulation layer disposed in the display region and the second module region on the first inorganic thin film encapsulation layer;
a second organic thin film encapsulation layer disposed in the first module region on the first inorganic thin film encapsulation layer; and
a second inorganic thin film encapsulation layer disposed on the first and second organic thin film encapsulation layers.

13. The organic light emitting diode display device of claim 12, wherein
the scatterers are disposed inside a portion of the first organic thin film encapsulation layer located in the second module region, and
the scatterers are disposed inside the second organic thin film encapsulation layer.

14. The organic light emitting diode display device of claim 12, wherein
the first organic thin film encapsulation layer is disposed on an outer side of the first partition structure,
the second organic thin film encapsulation layer is disposed on an inner side of the first partition structure,
a refractive index of the first organic thin film encapsulation layer located in the display region is different from a refractive index of the first organic thin film encapsulation layer located in the second module region, and
the refractive index of the first organic thin film encapsulation layer located in the display region is different from a refractive index of the second organic thin film encapsulation layer.

15. The organic light emitting diode display device of claim 11, wherein the display region surrounds at least a portion of the first module region and at least a portion of the second module region.

16. The organic light emitting diode display device of claim 11, further comprising:
a second partition structure disposed at an outer periphery of the second module region on the substrate to surround the third pixel structure.

17. The organic light emitting diode display device of claim 16, wherein the thin film encapsulation structure includes:
a first inorganic thin film encapsulation layer disposed on the first, second, and third pixel structures, the first partition structure and the second partition structure;
a first organic thin film encapsulation layer disposed in the display region on the first inorganic thin film encapsulation layer;
a second organic thin film encapsulation layer disposed in the first module region on the first inorganic thin film encapsulation layer;
a third organic thin film encapsulation layer disposed in the second module region on the first inorganic thin film encapsulation layer; and
a second inorganic thin film encapsulation layer disposed on the first, second, and third organic thin film encapsulation layers.

18. The organic light emitting diode display device of claim 17, wherein
the scatterers are disposed inside the second organic thin film encapsulation layer, and
the scatterers are disposed inside the third organic thin film encapsulation layer.

19. The organic light emitting diode display device of claim 17, wherein
the first organic thin film encapsulation layer is disposed on an outer side of each of the first and second partition structures,
the second organic thin film encapsulation layer is disposed on an inner side of the first partition structure,
the third organic thin film encapsulation layer is disposed on an inner side of the second partition structure,
a refractive index of the first organic thin film encapsulation layer is different from a refractive index of the second organic thin film encapsulation layer, and
the refractive index of the first organic thin film encapsulation layer is different from a refractive index of the third organic thin film encapsulation layer.

20. The organic light emitting diode display device of claim 11, wherein each of the first and second functional modules includes at least one selected from a camera module, a face recognition sensor module, a pupil recognition sensor module, an acceleration sensor module, a proximity sensor module, an infrared sensor module, and an illuminance sensor module.

\* \* \* \* \*